(12) United States Patent
Cho et al.

(10) Patent No.: US 12,119,374 B2
(45) Date of Patent: Oct. 15, 2024

(54) SEMICONDUCTOR DEVICE

(71) Applicant: SAMSUNG ELECTRONICS CO., LTD., Suwon-si (KR)

(72) Inventors: Gihee Cho, Yongin-si (KR); Sangyeol Kang, Yongin-si (KR); Jungoo Kang, Seoul (KR); Taekyun Kim, Suwon-si (KR); Jiwoon Park, Seoul (KR); Sanghyuck Ahn, Daegu (KR); Jin-Su Lee, Hwaseong-si (KR); Hyun-Suk Lee, Suwon-si (KR); Hongsik Chae, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 164 days.

(21) Appl. No.: 17/857,383

(22) Filed: Jul. 5, 2022

(65) Prior Publication Data

US 2022/0336578 A1    Oct. 20, 2022

Related U.S. Application Data

(63) Continuation of application No. 17/189,700, filed on Mar. 2, 2021, now Pat. No. 11,411,075.

(30) Foreign Application Priority Data

Jul. 29, 2020    (KR) ......................... 10-2020-0094799

(51) Int. Cl.
*H10B 12/00*    (2023.01)
*H01L 49/02*    (2006.01)

(52) U.S. Cl.
CPC ......... *H01L 28/92* (2013.01); *H10B 12/0335* (2023.02); *H10B 12/053* (2023.02);
(Continued)

(58) Field of Classification Search
None
See application file for complete search history.

(56) References Cited

U.S. PATENT DOCUMENTS 8,119,476 B2    2/2012    Kang et al.
8,790,986 B2    7/2014    Choi et al.
(Continued)

FOREIGN PATENT DOCUMENTS

CN    108022928 A    5/2018
JP    2016-58478 A    4/2016
(Continued)

*Primary Examiner* — Steven M Christopher
(74) *Attorney, Agent, or Firm* — Muir Patent Law, PLLC

(57) ABSTRACT

A semiconductor device and a method of manufacturing the same, the device including a plurality of lower electrodes on a semiconductor substrate; a support pattern connecting the lower electrodes at sides of the lower electrodes; and a dielectric layer covering the lower electrodes and the support pattern, wherein each of the plurality of lower electrodes includes a pillar portion extending in a vertical direction perpendicular to a top surface of the semiconductor substrate; and a protrusion protruding from a sidewall of the pillar portion so as to be in contact with the support pattern, the pillar portion includes a conductive material, the protrusion includes a same conductive material as the pillar portion and is further doped with impurities.

20 Claims, 23 Drawing Sheets

(52) U.S. Cl.
CPC ........... *H10B 12/315* (2023.02); *H10B 12/34* (2023.02); *H10B 12/482* (2023.02); *H10B 12/488* (2023.02)

(56) References Cited

U.S. PATENT DOCUMENTS

| | | |
|---|---|---|
| 8,969,167 B2 | 3/2015 | Yoon et al. |
| 9,761,591 B2 | 9/2017 | Kim et al. |
| 10,403,638 B2 | 9/2019 | Lee et al. |
| 10,804,219 B2 | 10/2020 | Sohn |
| 2004/0033698 A1 | 2/2004 | Lee et al. |
| 2006/0086952 A1 | 4/2006 | Kim et al. |
| 2010/0188795 A1 | 7/2010 | Kim et al. |
| 2012/0098092 A1 | 4/2012 | Park et al. |
| 2016/0020212 A1 | 1/2016 | Kim et al. |
| 2016/0104763 A1 | 4/2016 | Choi et al. |
| 2017/0025416 A1* | 1/2017 | Han .................... H10B 12/053 |
| 2018/0166320 A1 | 6/2018 | Kim |
| 2019/0267383 A1 | 8/2019 | Rocklein et al. |
| 2019/0333985 A1 | 10/2019 | Lee et al. |

FOREIGN PATENT DOCUMENTS

| | | |
|---|---|---|
| KR | 10-0750558 B1 | 8/2007 |
| KR | 10-2009-0044865 A | 5/2009 |
| KR | 10-2020-0054672 A | 5/2020 |

\* cited by examiner

SEMICONDUCTOR DEVICE

CROSS-REFERENCE TO RELATED APPLICATIONS

This is a continuation application based on pending application Ser. No. 17/189,700, filed Mar. 2, 2021, the entire contents of which is hereby incorporated by reference.

Korean Patent Application No. 10-2020-0094799, filed on Jul. 29, 2020, in the Korean Intellectual Property Office, and entitled: "Semiconductor Device and Method of Fabricating the Same," is incorporated by reference herein in its entirety.

BACKGROUND

1. Field

Embodiments relate to a semiconductor device and a method of manufacturing the same.

2. Description of the Related Art

Semiconductor devices may be used in an electronic industry because of their small sizes, multi-functional characteristics, and/or low manufacturing costs. Semiconductor devices have been highly integrated with the development of the electronic industry. Widths of patterns included in semiconductor devices have been reduced to increase the integration density of the semiconductor devices.

SUMMARY

The embodiments may be realized by providing a semiconductor device including lower electrodes on a semiconductor substrate; a support pattern connecting the lower electrodes at sides of the lower electrodes; and a dielectric layer covering the lower electrodes and the support pattern, wherein each of the lower electrodes includes a pillar portion extending in a vertical direction perpendicular to a top surface of the semiconductor substrate; and a protrusion protruding from a sidewall of the pillar portion so as to be in contact with the support pattern, the pillar portion includes a conductive material, and the protrusion includes a same conductive material as the pillar portion and is further doped with impurities.

The embodiments may be realized by providing a method of manufacturing a semiconductor device, the method including sequentially stacking a mold layer and a support layer on a substrate; forming lower electrodes that penetrate the support layer and the mold layer, such that the lower electrodes include a conductive material and have pillar shapes; etching the support layer to form a support pattern that is partially in contact with sidewalls of the lower electrodes, the support pattern including a support hole exposing the mold layer; removing the mold layer through the support hole to expose surfaces of the lower electrodes; injecting impurities into the lower electrodes to form a doped layer covering each of the lower electrodes; removing the impurities from a first portion of the doped layer exposed by the support pattern and leaving the impurities in a second portion of the doped layer located between the support pattern and each of the lower electrodes; and removing the first portion.

The embodiments may be realized by providing a semiconductor device a device isolation pattern defining active regions in a substrate; a word line in the substrate and intersecting the active regions; first doped regions in the active regions at one side of the word line, respectively; second doped regions in the active regions at another side of the word line, respectively; bit lines connected to the first doped regions, respectively, the bit lines intersecting the word line; lower electrode contacts connected to the second doped regions, respectively; lower electrodes on the lower electrode contacts, respectively; a support pattern on sidewalls of the lower electrodes to connect the lower electrodes; connection patterns between the support pattern and the lower electrodes; and a dielectric layer covering the lower electrodes and the support pattern, wherein a height of the connection pattern in a vertical direction perpendicular to a top surface of the substrate is substantially equal to a height of the support pattern in the vertical direction, as measured at an interface between the connection pattern and the support pattern, and the lower electrodes and the connection pattern, which are connected to each other, constitute one body formed of the same material.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
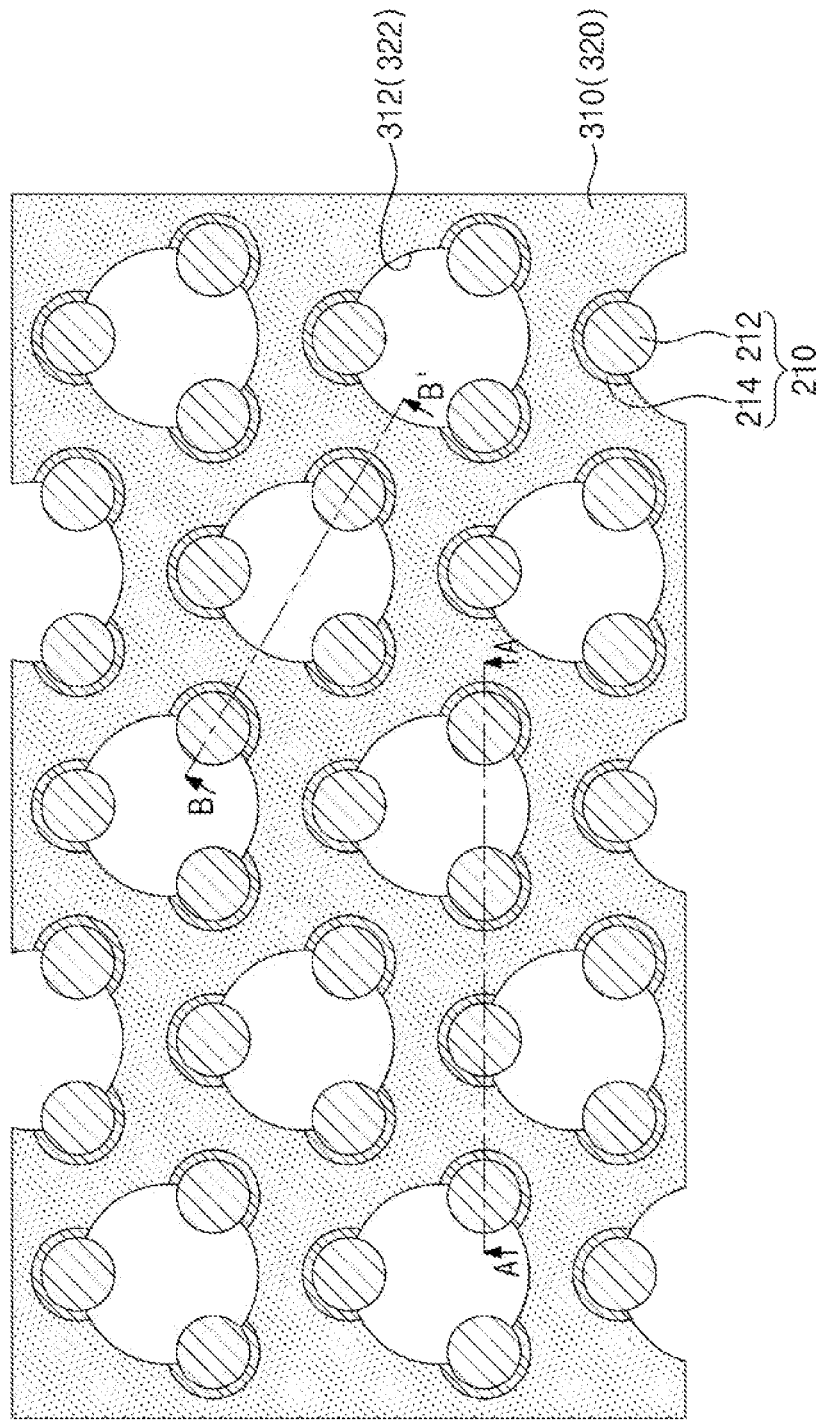
FIG. 1 is a plan view of a semiconductor device according to some example embodiments.
Figure 2:
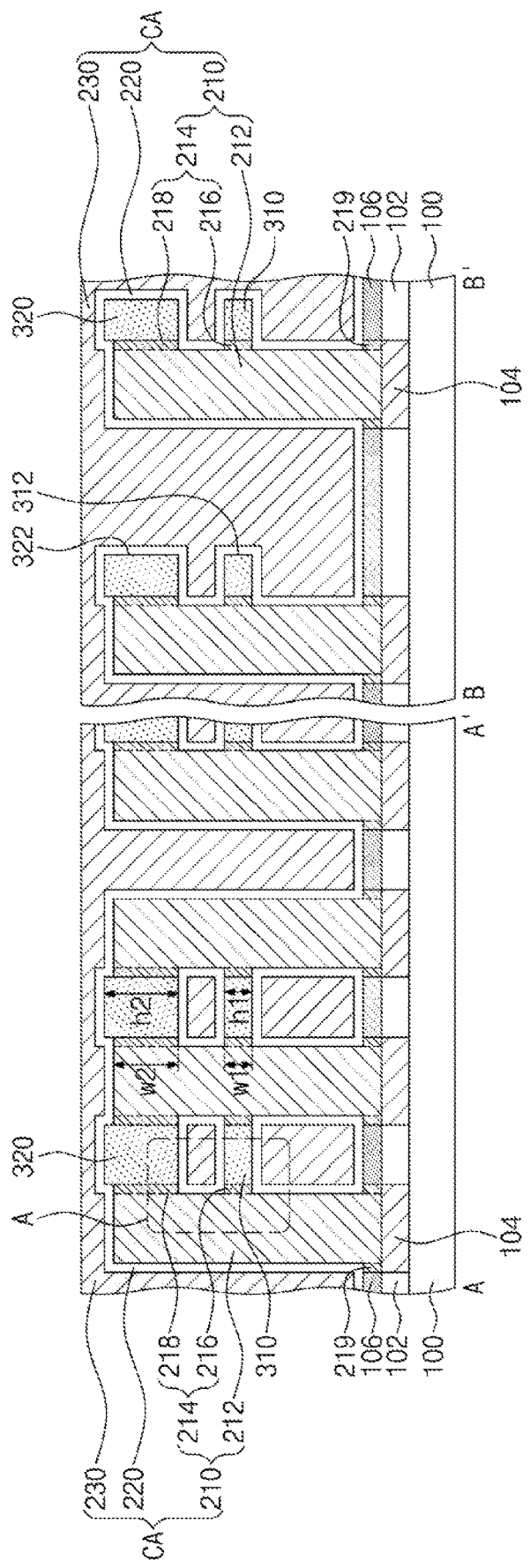
FIG. 2 is a cross-sectional view of a semiconductor device according to some example embodiments.
Figure 3:
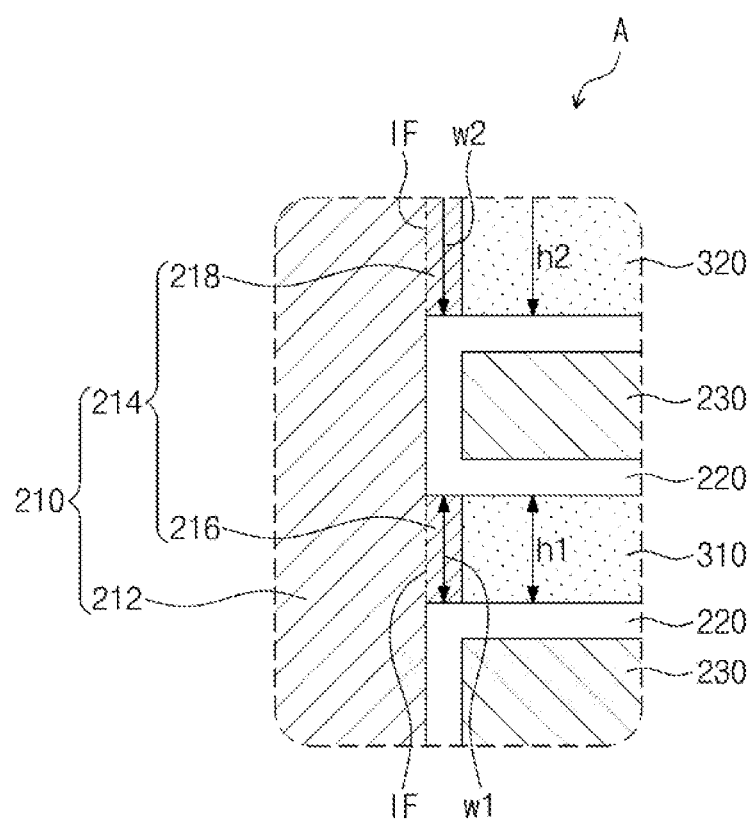
FIGS. 3 and 4 are enlarged views of a region 'A' of FIG. 2, according to some example embodiments.
Figure 4:
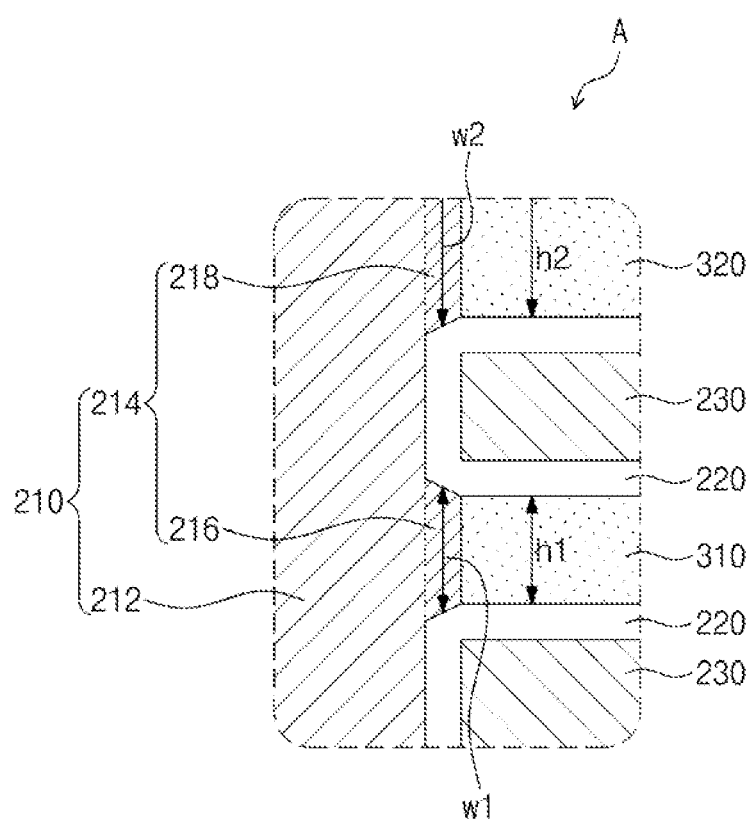

FIG. 1 is a plan view of a semiconductor device according to some example embodiments. FIG. 2 is a cross-sectional view taken along lines A-A' and B-B' of FIG. 1 to illustrate a semiconductor device according to some example embodiments. FIGS. 3 and 4 are enlarged views of a region 'A' of FIG. 2, according to some example embodiments.

Referring to FIGS. 1 to 3, a semiconductor substrate 100 may be provided. In an implementation, the semiconductor substrate 100 may be a single-crystalline silicon (Si) substrate. In an implementation, the semiconductor substrate 100 may include a substrate formed of a semiconductor material such as silicon-germanium (SiGe).

An interlayer insulating layer 102 may be on the semiconductor substrate 100. The interlayer insulating layer 102 may include an insulating material. In an implementation, when the semiconductor substrate 100 is a silicon (Si) substrate, the interlayer insulating layer 102 may include silicon oxide ($SiO_2$), silicon nitride (SiN), or silicon oxynitride (SiON). As used herein, the term "or" is not an exclusive term, e.g., "A or B" would include A, B, or A and B.

Lower electrode contacts 104 may be in the interlayer insulating layer 102. The lower electrode contacts 104 may penetrate the interlayer insulating layer 102 so as to be electrically connected to the semiconductor substrate 100. The lower electrode contacts 104 may include a conductive material. In an implementation, the lower electrode contacts 104 may include, e.g., poly-silicon doped with dopants, titanium nitride (TiN), or tungsten (W). In an implementation, as illustrated in FIG. 2, each of the lower electrode contacts 104 has a single-layered structure. In an implementation, each of the lower electrode contacts 104 may have a multi-layered structure.

In an implementation, semiconductor components may be provided on the semiconductor substrate 100. In an implementation, a device isolation layer may be in the semiconductor substrate 100. The device isolation layer may define active regions in the semiconductor substrate 100. Word lines may be buried in the semiconductor substrate 100. Each of the word lines may be insulated from the semiconductor substrate 100 by a gate insulating layer and a capping pattern. Dopant injection regions may be in the semiconductor substrate 100 (e.g., the active regions) at both sides of each of the word lines to form source/drain regions. Bit lines may be electrically connected to the dopant injection regions at one side of each of the word lines, respectively. The lower electrode contacts 104 may be electrically connected to the dopant injection regions not connected to the bit lines, respectively.

An etch stop layer 106 may be on the interlayer insulating layer 102. In an implementation, the etch stop layer 106 may include, e.g., a silicon nitride (SiN) layer, a silicon-boron nitride (SiBN) layer, a silicon carbonitride (SiCN) layer, or a combination thereof.

Lower electrodes 210 may be on the etch stop layer 106. The lower electrodes 210 may penetrate the etch stop layer 106 so as to be in contact with the lower electrode contacts 104, respectively. Each of the lower electrodes 210 may have a pillar shape. In an implementation, each of the lower electrodes 210 may have a plug shape having a circular section. The lower electrodes 210 may be arranged in a honey comb form when viewed in a plan view. In an implementation, six lower electrodes 210 may be arranged in a hexagonal form around one (e.g., central) lower electrode 210 when viewed in a plan view. A distance between the lower electrodes 210 adjacent to each other may range from 1 nm to 10 nm. The lower electrodes 210 may include a metal nitride. In an implementation, the lower electrodes 210 may include, e.g., titanium nitride (TiN), titanium-silicon nitride (TiSiN), titanium-aluminum nitride (TiAlN), or tantalum nitride (TaN). In an implementation, the lower electrodes 210 may include a metal, a metal oxide, or doped poly-silicon.

Sidewalls of the lower electrodes 210 may be in contact with a first support pattern 310 and a second support pattern 320. The first support pattern 310 and the second support pattern 320 may be spaced apart from each other. The second support pattern 320 may be located over (e.g., farther from the substrate 100 in a vertical direction than) the first support pattern 310. A top surface of the second support pattern 320 may be at a higher level (e.g., farther from the substrate 100 in the vertical direction) than top surfaces of the lower electrodes 210. In an implementation, the top surface of the second support pattern 320 may be coplanar with the top surfaces of the lower electrodes 210. In an implementation, each of the first and second support patterns 310 and 320 may include, e.g., a silicon nitride (SiN) layer, a silicon-boron nitride (SiBN) layer, a silicon carbonitride (SiCN) layer, or a combination thereof.

The first support pattern 310 and the second support pattern 320 may have different thicknesses (e.g., as measured in the vertical direction) from each other. In an implementation, a second height h2 of the second support pattern 320 may be greater than a first height h1 of the first support pattern 310. Each of the first and second heights h1 and h2 of the first and second support patterns 310 and 320 may range from 0.3 Å to 50 Å. Each of the first and second support patterns 310 and 320 may have support holes. The first support pattern 310 may have first support holes 312. The second support pattern 320 may have second support holes 322. The first support holes 312 may vertically overlap with the second support holes 322. Each of the support holes 312 and 322 may expose sidewalls of three lower electrodes 210 that are adjacent to each other.

Connection patterns 214 may be between the first support pattern 310 and the lower electrodes 210 and between the second support pattern 320 and the lower electrodes 210. The connection patterns 214 may be protrusions 214 that extend outwardly from sidewalls of pillar portions 212, having pillar shapes, of the lower electrodes 210 toward the first and second support patterns 310 and 320. In an implementation, each of the connection patterns 214 may be a portion of the lower electrode 210, and may protrude from the sidewall of the pillar portion 212. In an implementation, the protrusion 214 and the pillar portion 212 of the lower electrode 210 may constitute a continuous component (e.g., may be a monolithic, one-piece structure), and an interface IF between the pillar portion 212 and the protrusion 214 may not be visible or present. In an implementation, the pillar portion 212 and the protrusion 214 may be formed of a same material, and the interface IF between the pillar portion 212 and the protrusion 214 may not exist. In an implementation, the pillar portion 212 and the protrusion 214 may constitute a single component. Hereinafter, the protrusion 214 will be referred to as the connection pattern 214. The connection patterns 214 may include first connection patterns 216 between the first support pattern 310 and the pillar portions 212 and second connection patterns 218 between the second support pattern 320 and the pillar portions 212. The first connection patterns 216 may be in contact with the first support pattern 310. The second connection patterns 218 may be in contact with the second support pattern 320. Near or at an interface between the first connection pattern 216 and the first support pattern 310, a first width w1 (e.g., height) of the first connection pattern 216 in a direction perpendicular to a top surface of the semiconductor substrate 100 (e.g., the vertical direction) may be substantially equal to or greater than the first height h1 of the first support pattern 310. The first connection pattern 216 connecting the pillar portion 212 of the lower electrode 210 and the first support pattern 310 may be connected to or contact the whole of a sidewall of the first support pattern 310, and thus the pillar portion 212 and the first support pattern 310 may be firmly connected to each other. The first width w1 of the first connection pattern 216 may be substantially uniform from the pillar portion 212 toward or to the first support pattern 310. A second width w2 (e.g., height) of the second connection pattern 218 in the perpendicular or vertical direction may be substantially uniform from the pillar portion 212 toward or to the second support pattern 320. In an implementation, as illustrated in FIG. 4, the first connection pattern 216 may have a tapered shape, e.g., the first width w1 of the first connection pattern 216 may be reduced from the pillar portion 212 toward the first support pattern 310 (e.g., a height of the first connection pattern 216 proximate to the pillar portion 212 may be greater than a height of the first connection pattern 216 proximate to the first support pattern 310). In an implementation, the second connection pattern 218 may have a tapered shape, e.g., the second width w2 of the second connection pattern 218 may be reduced from the pillar portion 212 toward the second support pattern 320.

The connection patterns 214 may include a same material as the pillar portion 212. In an implementation, the connection patterns 214 may include a metal nitride. In an implementation, the connection patterns 214 may include, e.g., titanium nitride (TiN), titanium-silicon nitride (TiSiN), titanium-aluminum nitride (TiAlN), or tantalum nitride (TaN). The connection patterns 214 may further contain first impurities. In an implementation, the first impurities may include, e.g., carbon (C) or boron (B). In an implementation, a content (e.g., atomic percent) of the first impurities in the connection patterns 214 may range from 3 at % to 50 at %.

The connection patterns 214 may further include a connection pattern 219 between the pillar portion 212 and the etch stop layer 106. In an implementation, the connection pattern may not be provided between the pillar portion 212 and the etch stop layer 106.

The content of the first impurities may be changed or may vary depending on a relative position within each of the connection patterns 214 (e.g., the connection patterns 214 may have a concentration gradient of first impurities therein). The content of the first impurities in each of the connection patterns 214 may be lower near or proximate to the pillar portion 212 and may be higher near or proximate to the interface between each of the connection patterns 214 and each of the support patterns 310 and 320 (e.g., with a concentration gradient therein). In an implementation, the content of the first impurities may be substantially uniform within each of the connection patterns 214. The connection patterns 214 may contain the first impurities, and a density of the connection patterns 214 may be increased. In an implementation, the connection patterns 214 may firmly connect the lower electrodes 210 and the support patterns 310 and 320, and structural stability of the semiconductor device may be improved.

In an implementation, as illustrated in FIGS. 2 to 4, the connection patterns 214 of the lower electrodes 210 may contain the first impurities, and the pillar portions 212 of the lower electrodes 210 may not contain the first impurities. In an implementation, the pillar portions 212 of the lower electrodes 210 may contain the first impurities. In an implementation, the pillar portions 212 and the connection patterns 214 of the lower electrodes 210 may be formed of the same material. In an implementation, a content of the first impurities in the pillar portion 212 may be substantially equal to or lower than the content of the first impurities in each of the connection patterns 214.

A dielectric layer 220 may be on the lower electrodes 210 and the first and second support patterns 310 and 320. The dielectric layer 220 may have a substantially uniform thickness and may cover surfaces of the lower electrodes 210 and surfaces of the first and second support patterns 310 and 320. The dielectric layer 220 may be in contact (e.g., direct contact) with a remaining portion of the surface of the pillar portion 212, except portions of the sidewall of the pillar portion 212 that are already covered by the first and second support patterns 310 and 320. The dielectric layer 220 may include an insulating material. The dielectric layer 220 may have a dielectric constant higher than that of silicon oxide ($SiO_2$) or silicon nitride (SiN). In an implementation, the dielectric layer 220 may include, e.g., a metal oxide layer such as an aluminum oxide ($Al_2O_3$) layer or a hafnium oxide ($HfO_2$) layer.

An upper electrode 230 may be on the dielectric layer 220. The upper electrode 230 may include a metal (e.g., titanium nitride (TiN) or tungsten (W)), doped poly-silicon, or a combination thereof. The lower electrode 210, the dielectric layer 220 and the upper electrode 230 may constitute a capacitor CA.

Figure 5:
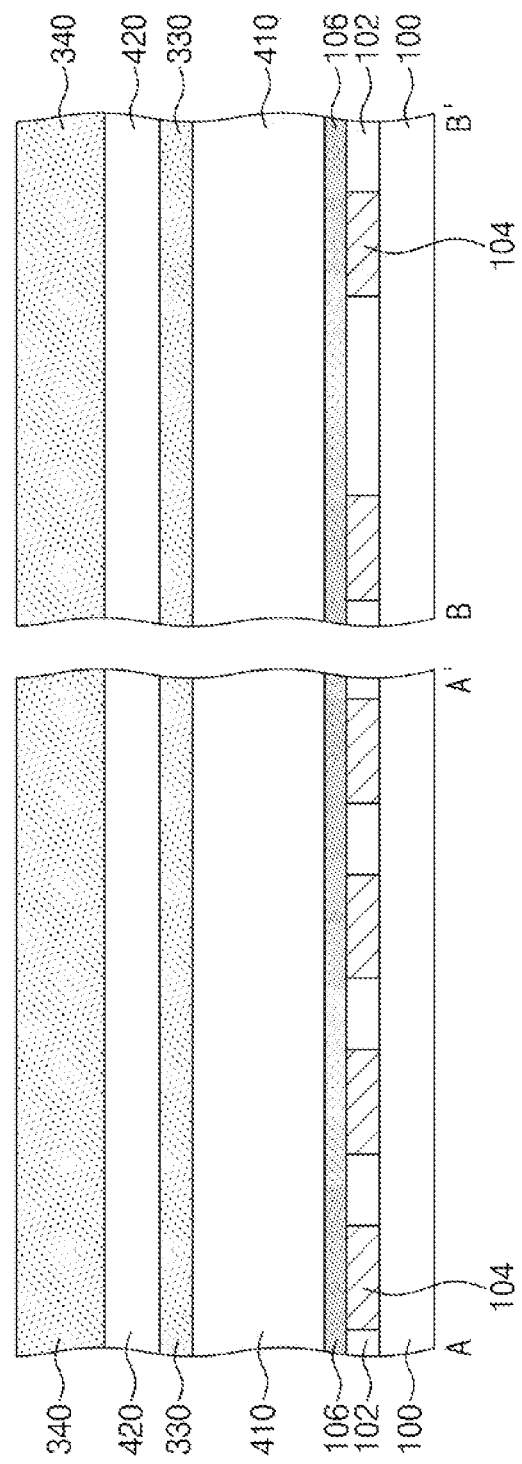
FIGS. 5 to 14 are views of stages in a method of manufacturing a semiconductor device, according to some example embodiments.
Figure 6:
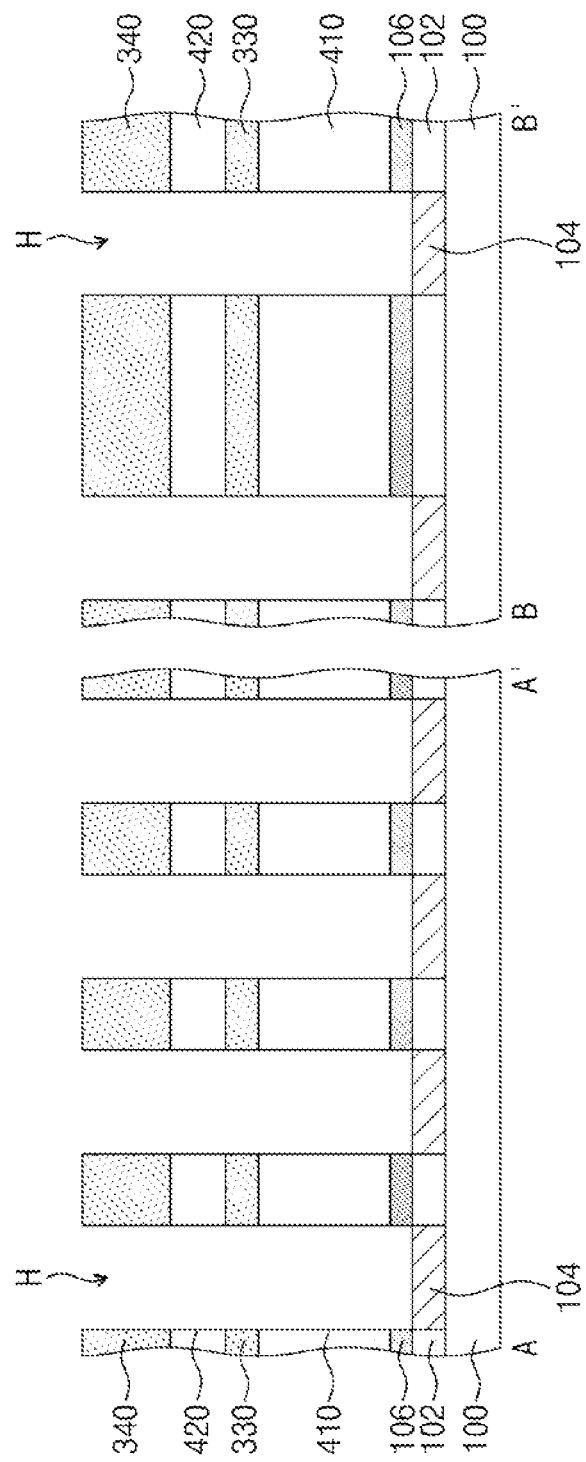
Figure 7:
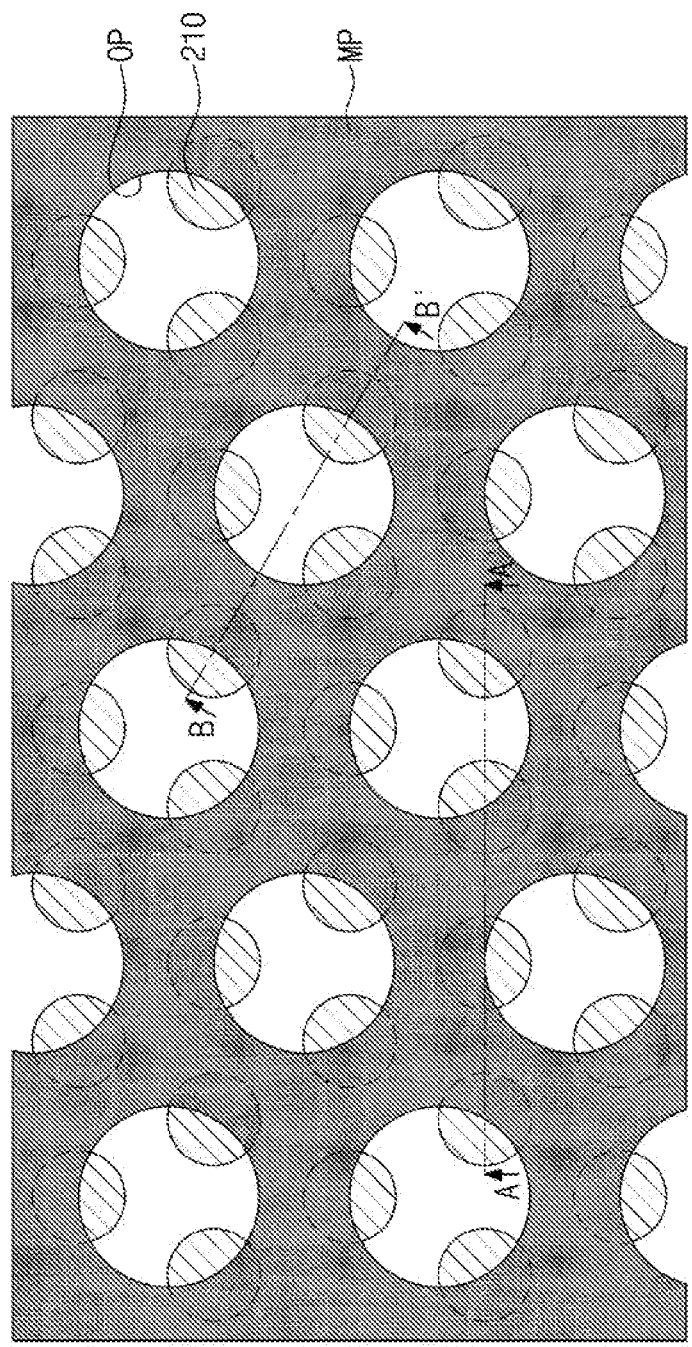

FIGS. 5 to 14 illustrate views of stages in a method of manufacturing a semiconductor device, according to some example embodiments. FIG. 7 is a plan view of some processes of a method of manufacturing a semiconductor device, according to some example embodiments. Hereinafter, the same components as described with reference to FIGS. 1 to 4 will be indicated by the same reference designators for the purpose of ease and convenience in explanation.

Referring to FIG. 5, an interlayer insulating layer 102 may be formed on a semiconductor substrate 100. Lower electrode contacts 104 may be formed in the interlayer insulating layer 102. An etch stop layer 106 may be formed on the interlayer insulating layer 102 and the lower electrode contacts 104.

Thereafter, a first mold layer 410, a first support layer 330, a second mold layer 420, and a second support layer 340 may be sequentially stacked on the etch stop layer 106. The first support layer 330 and the second support layer 340 may be formed of the same material. The first mold layer 410 and the second mold layer 420 may be formed of the same material. The first mold layer 410 and the second mold layer 420 may include a material having an etch selectivity with respect to the first support layer 330 and the second support layer 340. In an implementation, each of the first and second mold layers 410 and 420 may be formed of a silicon oxide ($SiO_2$) layer. Each of the first and second support layers 330 and 340 may be formed of a single layer or multi-layer of a silicon nitride (SiN) layer, a silicon-boron nitride (SiBN) layer, or a silicon carbonitride (SiCN) layer. The first mold layer 410 may be formed to be thicker (e.g., in the vertical direction) than the second mold layer 420. The second support layer 340 may be formed to be thicker than the first support layer 330.

Lower electrodes 210 may be formed to penetrate the first and second mold layers 410 and 420 and the first and second support layers 330 and 340.

Referring to FIG. 6, the second support layer 340, the second mold layer 420, the first support layer 330 and the first mold layer 410 may be sequentially etched to form lower electrode holes H exposing the lower electrode contacts 104, respectively. In an implementation, a mask pattern may be formed on the second support layer 340, and then, the etching process may be performed using the mask pattern as an etch mask.

Figure 8:
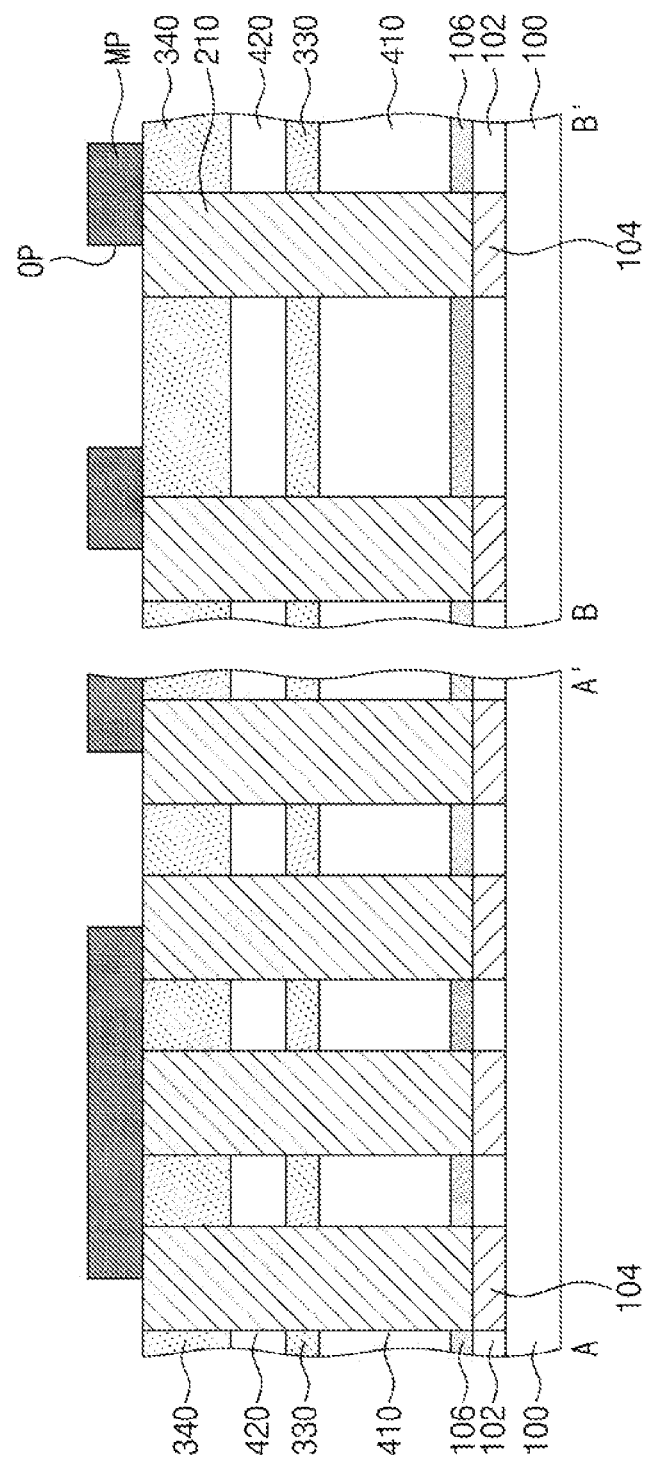

Referring to FIGS. 7 and 8, the lower electrodes 210 may be formed in the lower electrode holes H, respectively. In an implementation, a conductive layer may be formed on an entire top surface of the semiconductor substrate 100 to fill the lower electrode holes H, and then, an etch-back process may be performed on the conductive layer to form the lower electrodes 210 in the lower electrode holes H, respectively. In the etch-back process, the conductive layer on a top surface of the second support layer 340 may be removed to expose the top surface of the second support layer 340.

A mask pattern MP may be formed on the second support layer 340. The mask pattern MP may have openings OP partially exposing top surfaces of the lower electrodes 210.

In an implementation, each of the openings OP may expose portions of the top surfaces of three lower electrodes 210 adjacent to each other and the top surface of the second support layer 340 between the three lower electrodes 210.

Figure 9:
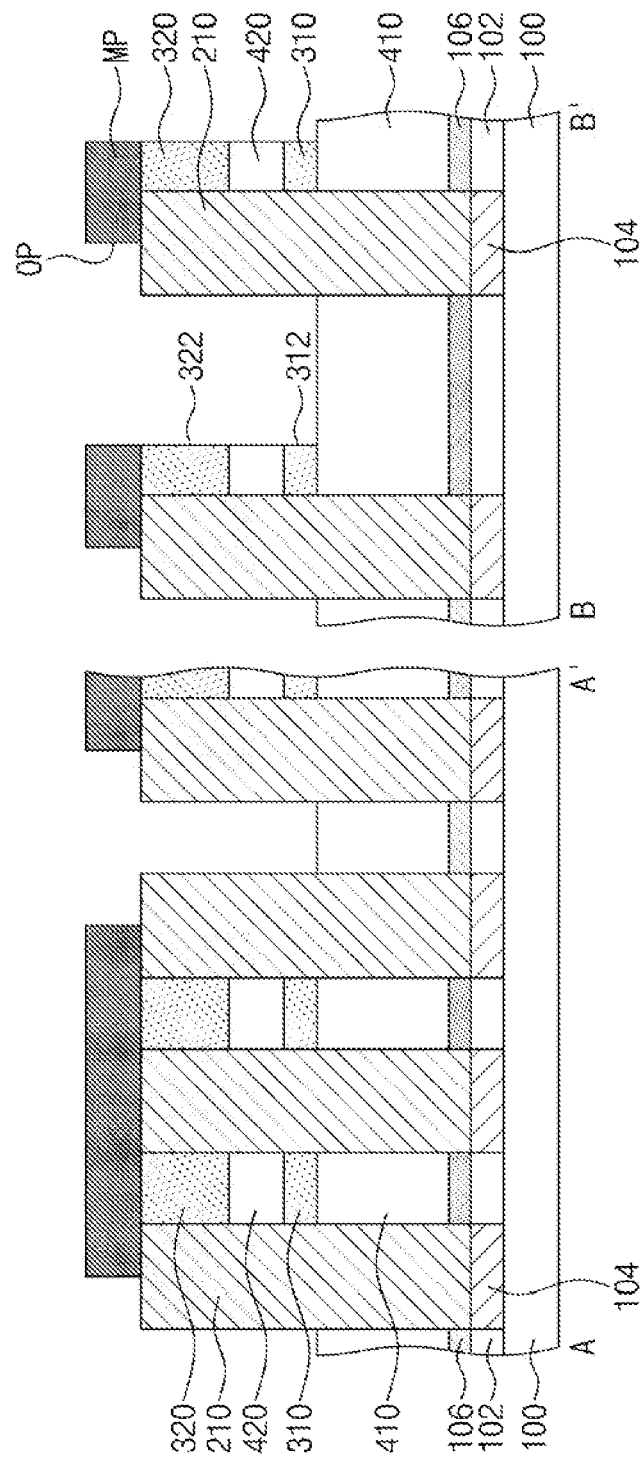

Referring to FIG. 9, the second support layer 340 and the first support layer 330 may be patterned to form support patterns 310 and 320 having support holes 312 and 322. In an implementation, an anisotropic etching process may be performed using the mask pattern MP as an etch mask to sequentially pattern the second support layer 340 exposed by the openings OP, the second mold layer 420 thereunder, and the first support layer 330 thereunder. At this time, the support holes 312 and 322 exposing a top surface of the first mold layer 410 may be formed. A second support pattern 320 having second support holes 322 may be formed by patterning the second support layer 340. A first support pattern 310 having first support holes 312 may be formed by patterning the first support layer 330. The first support holes 312 may vertically overlap with the second support holes 322, respectively, and may have the same/similar shape and size as the second support holes 322. In addition, at this time, a sidewall of the second mold layer 420 may also be exposed.

Figure 10:
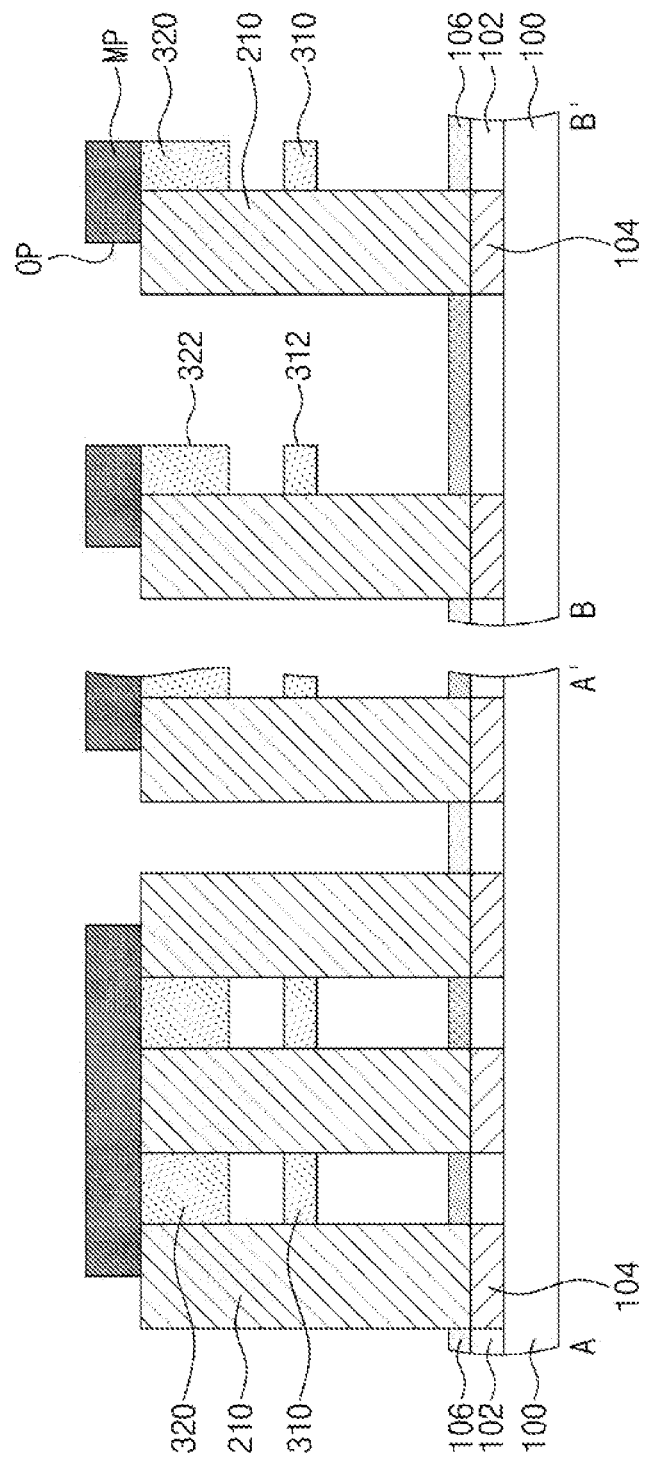

Referring to FIG. 10, the first and second mold layers 410 and 420 may be removed through the first and second support holes 312 and 322. In an implementation, an isotropic etching process may be performed to remove the first and second mold layers 410 and 420 exposed by the first and second support holes 312 and 322. Thus, surfaces of the lower electrodes 210 may be exposed. At this time, a top surface of the etch stop layer 106 and top surfaces, sidewalls, and bottom surfaces of the first and second support patterns 310 and 320 may be exposed.

In an implementation, the second support layer 340 may be etched by an anisotropic etching process to form the second support pattern 320 having the second support holes 322, and then, the second mold layer 420 may be removed through the second support holes 322 by an isotropic etching process. Thereafter, the first support layer 330 may be etched by an anisotropic etching process to form the first support pattern 310 having the first support holes 312, and then, the first mold layer 410 may be removed through the first support holes 312 by an isotropic etching process.

Figure 11:
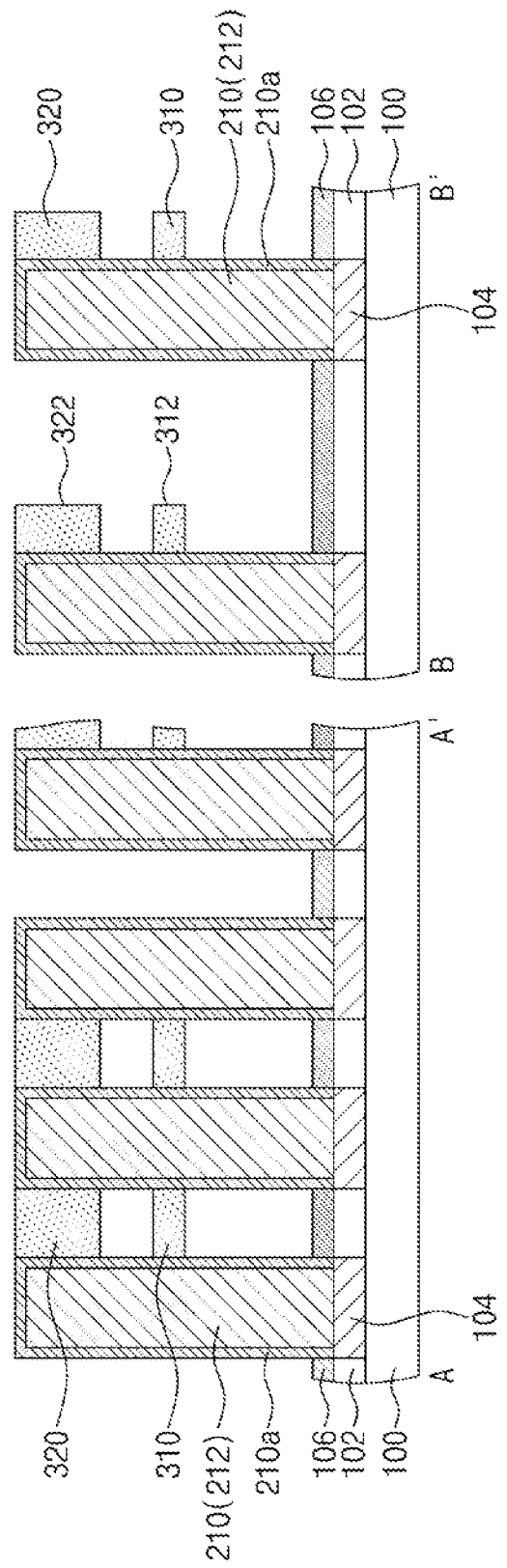

Referring to FIG. 11, the mask pattern MP may be removed from the resultant structure of FIG. 10.

A doped layer 210a may be formed on a surface of each of the lower electrodes 210. In an implementation, a surface portion of each of the lower electrodes 210 may be doped with first impurities to form the doped layer 210a. The first impurities may permeate into grain boundaries of the lower electrodes 210. At this time, a portion of each of the lower electrodes 210, which is not doped with the first impurities, may correspond to the pillar portion 212 described with reference to FIG. 2. The doped layer 210a may be formed to cover a sidewall and a top surface of the pillar portion 212. The first impurities may include carbon (C) or boron (B). A content (e.g., atomic percent) of the first impurities in the doped layer 210a may range from 3 at % to 50 at %.

Figure 12:
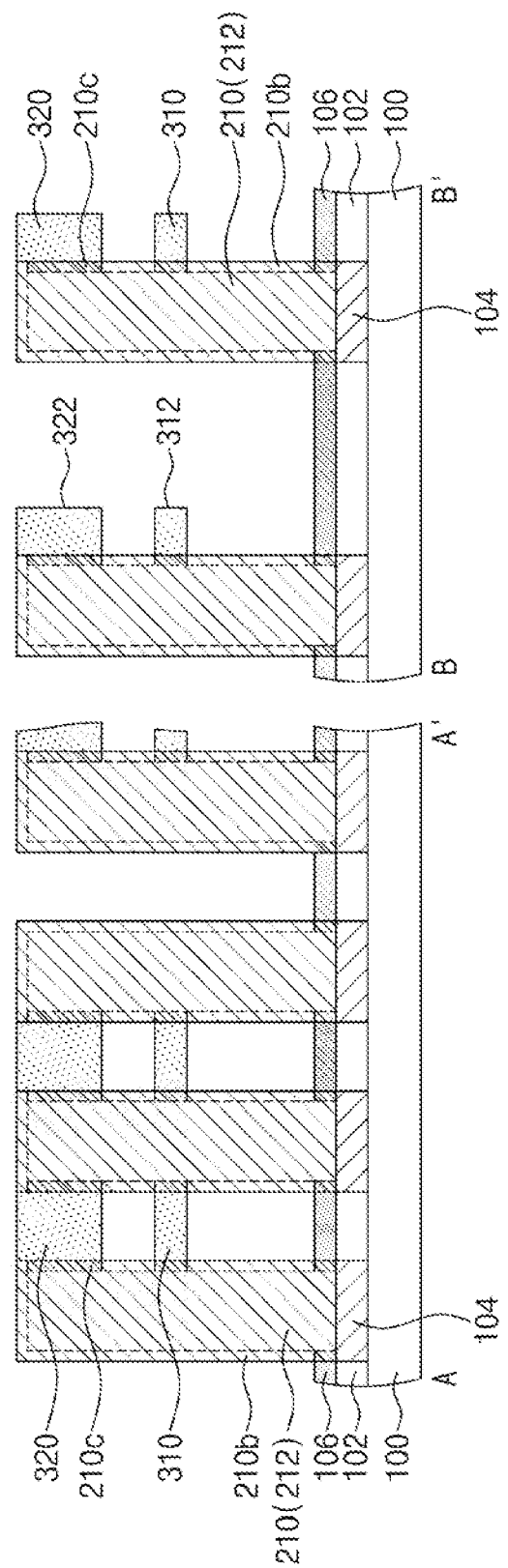

Referring to FIG. 12, the first impurities may be removed from a portion of the doped layer 210a. In an implementation, the first impurities may be removed from first portions 210b of the doped layer 210a, which are exposed (e.g., not covered) by the first and second support patterns 310 and 320 and the etch stop layer 106. In an implementation, an ashing process may be performed on exposed surfaces of the lower electrodes 210, e.g., surfaces of the first portions 210b of the doped layer 210a exposed by the first and second support patterns 310 and 320 and the etch stop layer 106. The ashing process may include a plasma surface treatment process, a thermal treatment process, or an oxidation process. At this time, the ashing process may not be performed on second portions 210c of the doped layer 210a, which are covered by the first and second support patterns 310 and 320 and the etch stop layer 106, and the first impurities may remain in the second portions 210c. The ashing process may be performed on the surfaces of the first portions 210b, and a height of the remaining second portion 210c may be substantially equal to a thickness (or a height) of the first support pattern 310 adjacent thereto or a thickness (or a height) of the second support pattern 320 adjacent thereto.

The first impurities may be removed from the first portions 210b of the doped layer 210a as described above, and the first portions 210b may include the same material as the pillar portion 212. At this time, crystal defects of the first portion 210b may be more than crystal defects of the second portion 210c and crystal defects of the pillar portion 212 (e.g., the first portion 210b may include a greater number of crystal defects than the second portion 210c and the pillar portion 212). In an implementation, the first impurities permeated in crystal structures of the first portions 210b may be removed, and vacancies may be formed in the crystal structures of the first portions 210b. The vacancies may correspond to the crystal defects. In an implementation, a strength of the first portions 210b may be weaker than a strength of the pillar portion 212 and a strength of the second portions 210c, and the first portions 210b may have an etch selectivity with respect to the second portions 210c in a subsequent etching process.

Figure 13:
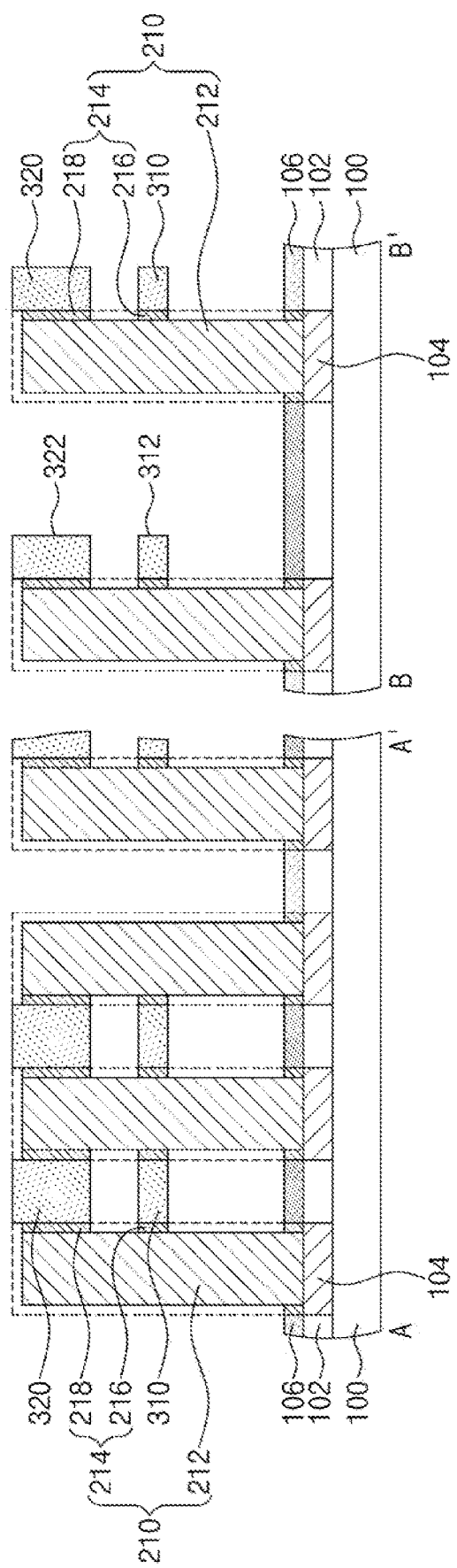

Referring to FIG. 13, the first portions 210b of the lower electrodes 210 may be removed. In an implementation, an isotropic etching process may be performed to etch the exposed first portions 210b. In the etching process, the first portions 210b having a lot of the crystal defects may be easily etched but the pillar portion 212 and the second portions 210c may not be etched. At this time, the second portions 210c in contact with the first and second support patterns 310 and 320 may not be etched. Thus, an undercut caused by etching of portions of the lower electrode 210 located between the pillar portion 212 and the first and second support patterns 310 and 320 may not occur, and it is possible to prevent the first and second support patterns 310 and 320 from being separated from the pillar portion 212. As a result, structural stability of the semiconductor device may be improved. In addition, the first portions 210b of the lower electrodes 210 may be removed, and widths of the lower electrodes 210 may be reduced. Thus, the integration density of the semiconductor device may be improved.

The second portions 210c remaining after the etching process may be the connection patterns 214 described with reference to FIG. 2. In an implementation, the second portion 210c between the pillar portion 212 and the first support pattern 310 may be the first connection pattern 216, and the second portion 210c between the pillar portion 212 and the second support pattern 320 may be the second connection pattern 218.

Figure 14:
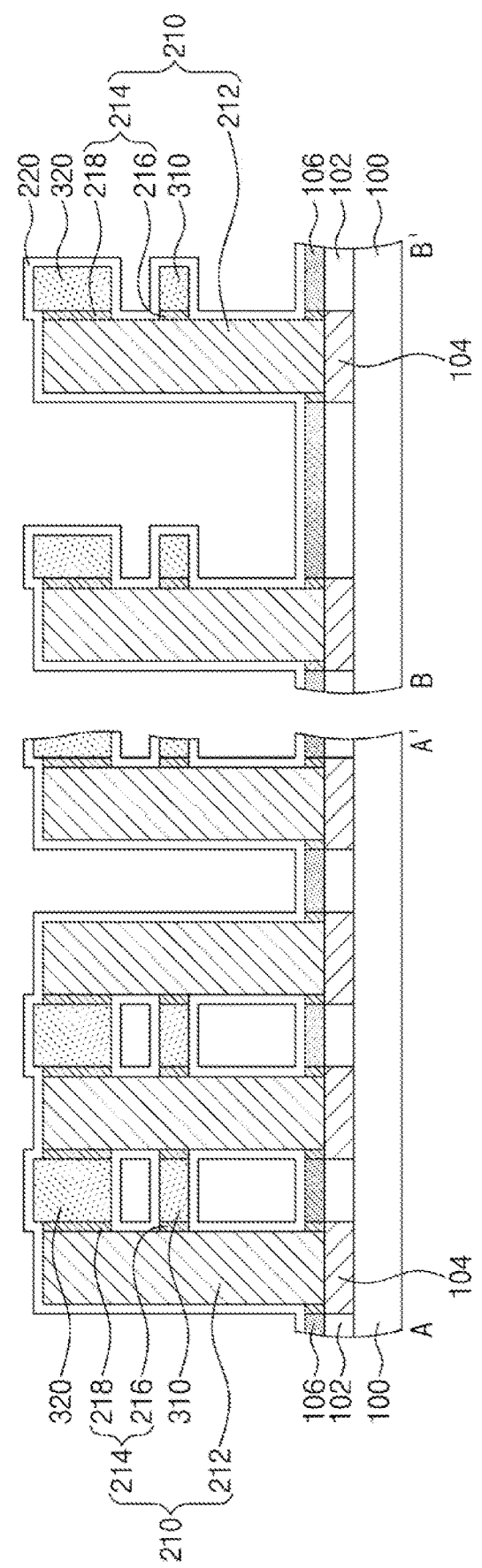

Referring to FIG. 14, a dielectric layer 220 may be formed on an entire top surface of the semiconductor substrate 100. The dielectric layer 220 may be formed with a substantially uniform thickness on the top surface of the etch stop layer 106, the top surfaces, the sidewalls and the bottom surfaces of the first and second support patterns 310 and 320, and exposed surfaces of the lower electrodes 210. Due to the presence of the connection patterns 214, the dielectric layer 220 may not be provided between the pillar portion 212 and the first support pattern 310 and between the pillar portion 212 and the second support pattern 320.

Referring again to FIG. 2, an upper electrode 230 may be formed on the dielectric layer 220. In an implementation, the upper electrode 230 may be formed by depositing or coating a conductive material on the semiconductor substrate 100.

The semiconductor device described with reference to FIG. 2 may be manufactured as described above.

Figure 15:
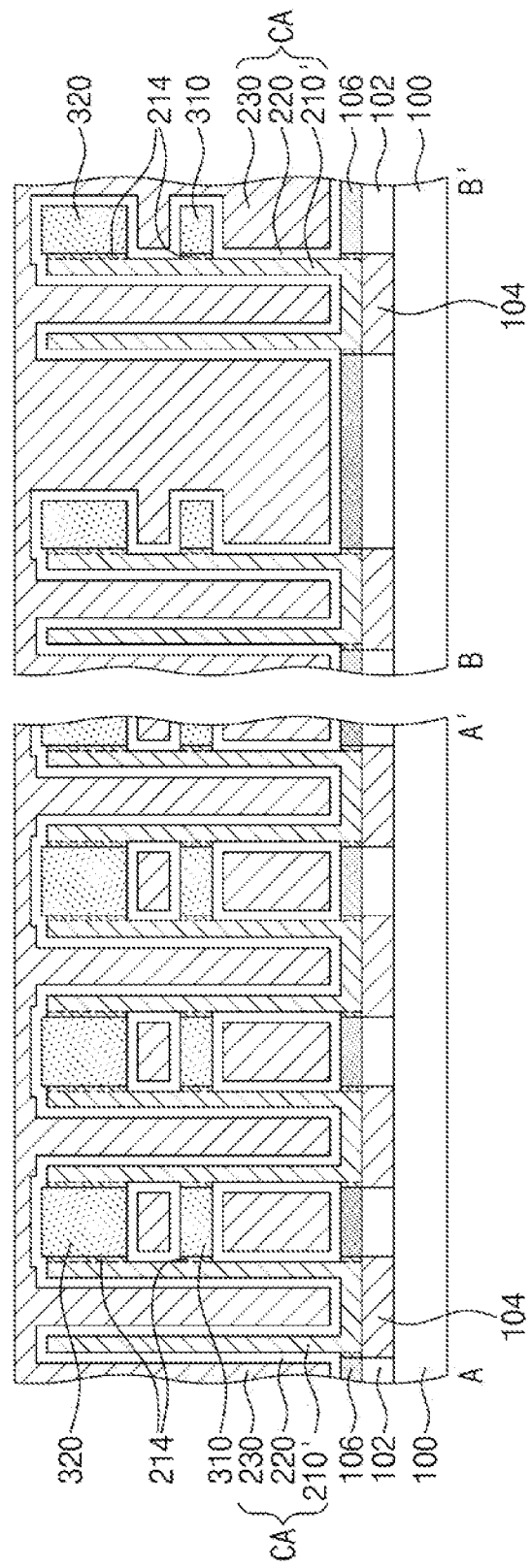
FIG. 15 is a cross-sectional view of a semiconductor device according to some example embodiments.

FIG. 15 is a cross-sectional view of a semiconductor device according to some example embodiments. In the present embodiments, the descriptions to the same technical features as in the embodiments of FIGS. 1 to 4 will be omitted for the purpose of ease and convenience in explanation. In other words, differences between the present embodiments and the embodiments of FIGS. 1 to 4 will be mainly described hereinafter in detail. Hereinafter, the same components as in the aforementioned embodiments will be indicated by the same reference designators.

Referring to FIG. 15, each of lower electrodes 210' may have a hollow cup shape or a hollow cylinder shape.

The connection patterns 214 may be between the first support pattern 310 and outer sidewalls of the lower electrodes 210' and between the second support pattern 320 and the outer sidewalls of the lower electrodes 210'. The connection patterns 214 may be protrusions 214 extending from the outer sidewalls of the lower electrodes 210' toward the first and second support patterns 310 and 320. In an implementation, the connection patterns 214 may be portions of the lower electrodes 210'.

The dielectric layer 220 may cover inner sidewalls of the lower electrodes 210' as well as the outer sidewalls of the lower electrodes 210'. The upper electrode 230 may extend into the insides of the lower electrodes 210'. Other components may be the same/similar as described with reference to FIGS. 1 to 4.

FIGS. 16 to 21 are views of stages in a method of manufacturing a semiconductor device, according to some example embodiments.

Figure 16:
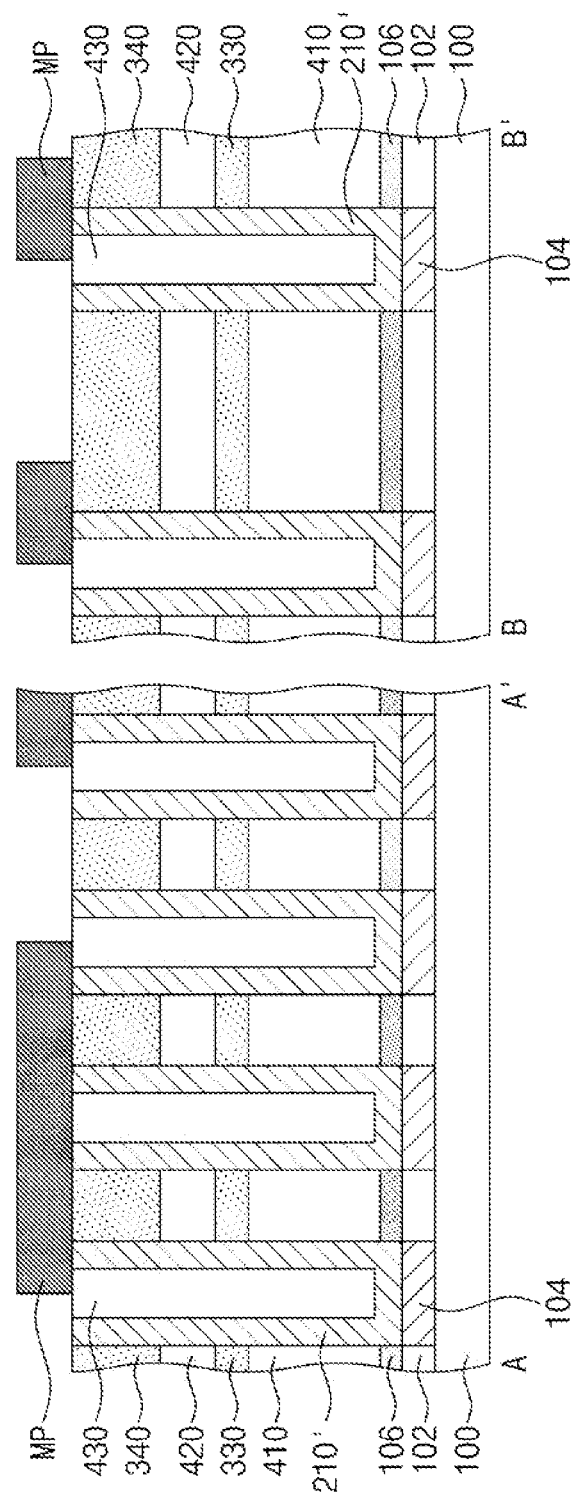
FIGS. 16 to 21 are views of stages in a method of manufacturing a semiconductor device, according to some example.

Referring to FIG. 16, a conductive layer may be formed with a substantially uniform thickness on bottom surfaces and inner sidewalls of the lower electrode holes H and the top surface of the second support layer 340 of the resultant structure of FIG. 6. At this time, a thickness of the conductive layer may be relatively thin, and the conductive layer may not completely fill the lower electrode holes H. A sacrificial layer 430 may be formed on the conductive layer to fill the lower electrode holes H. Thereafter, an etch-back process or a chemical mechanical polishing (CMP) process may be performed on the sacrificial layer 430 and the conductive layer to expose the top surface of the second support layer 340. At this time, lower electrodes 210' and the sacrificial layer 430 may remain in the lower electrode holes H.

A mask pattern MP may be formed on the second support layer 340. The mask pattern MP may have openings OP partially exposing top surfaces of the lower electrodes 210'. In an implementation, each of the openings OP may expose portions of the top surfaces of three lower electrodes 210' adjacent to each other and the top surface of the second support layer 340 between the three lower electrodes 210'. At this time, the openings OP may also expose portions of top surfaces of the sacrificial layers 430 in the lower electrode holes H.

Figure 17:
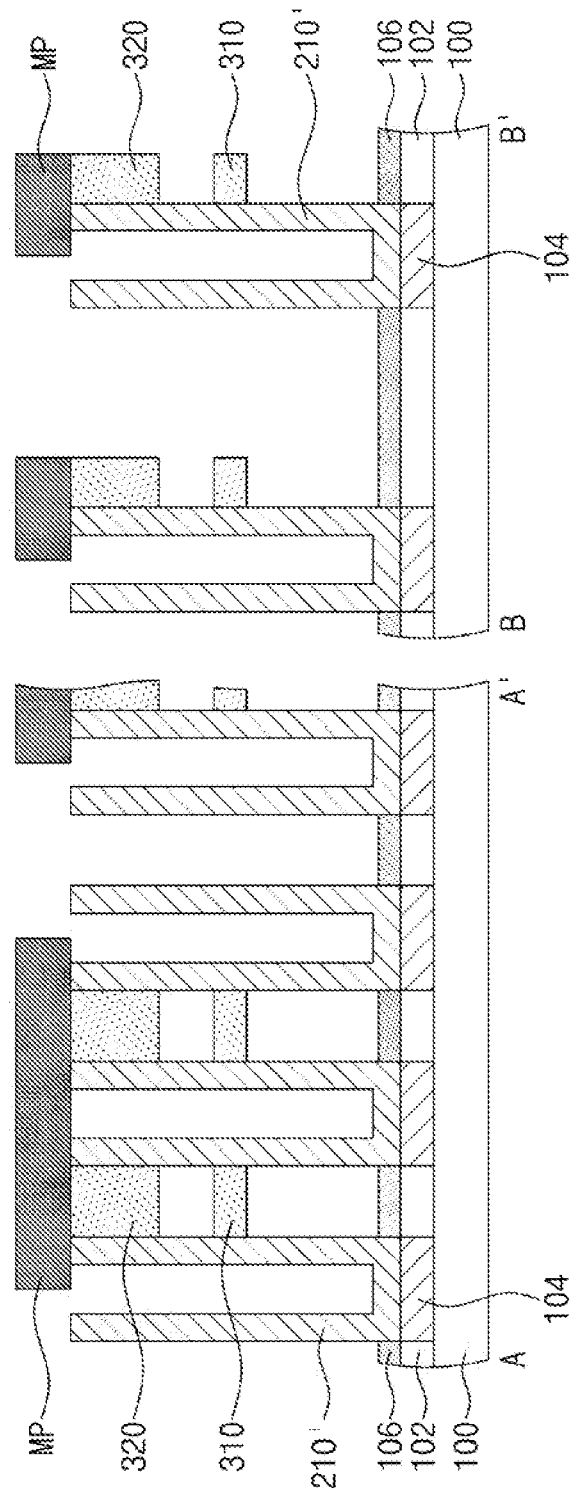

Referring to FIG. 17, the second support layer 340 and the first support layer 330 may be patterned to form support patterns 310 and 320 having support holes 312 and 322. In an implementation, an anisotropic etching process may be performed using the mask pattern MP as an etch mask to sequentially pattern the second support layer 340 exposed by the openings OP, the second mold layer 420 thereunder, and the first support layer 330 thereunder. At this time, the support holes 312 and 322 exposing a top surface of the first mold layer 410 may be formed. A second support pattern 320 having second support holes 322 may be formed by patterning the second support layer 340. A first support pattern 310 having first support holes 312 may be formed by patterning the first support layer 330. When the second mold layer 420 is etched, the sacrificial layer 430 may also be removed.

The first and second mold layers 410 and 420 may be removed through the first and second support holes 312 and 322. In an implementation, an isotropic etching process may be performed to remove the first and second mold layers 410 and 420 exposed by the first and second support holes 312 and 322. Thus, surfaces of the lower electrodes 210' may be exposed. At this time, a top surface of the etch stop layer 106 and top surfaces, sidewalls, and bottom surfaces of the first and second support patterns 310 and 320 may be exposed. When the sacrificial layer 430 remains in the lower electrode holes H in the process of forming the first and second support holes 312 and 322, the remaining sacrificial layer 430 may also be removed in the removal process of the first and second mold layers 410 and 420.

Figure 18:
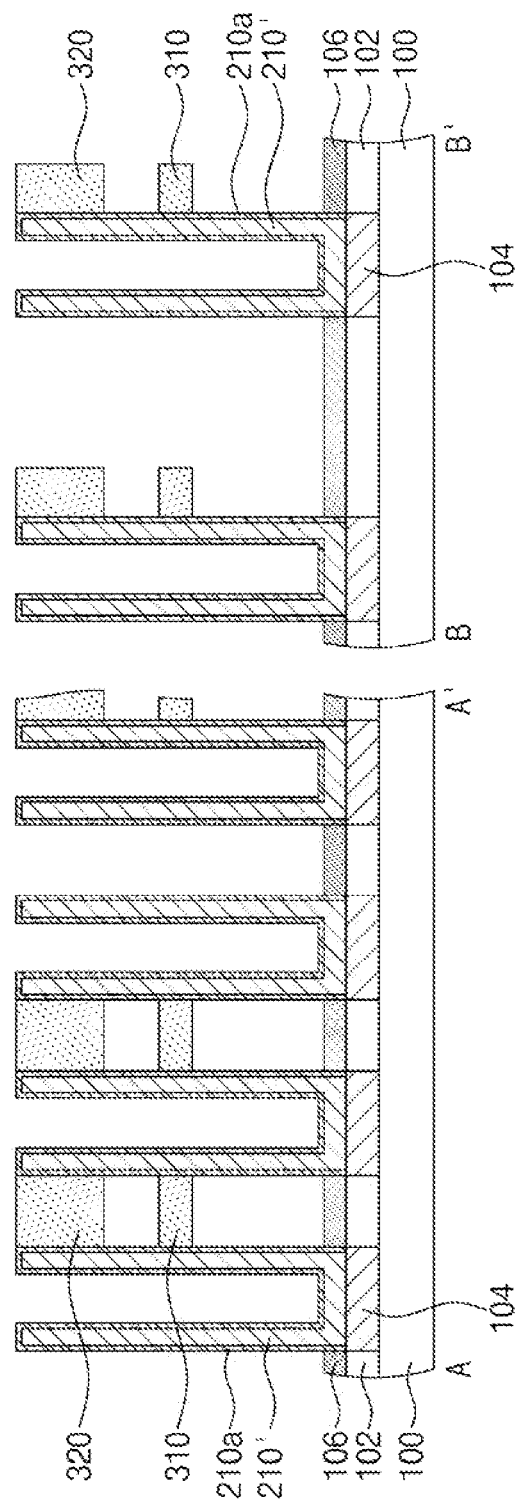

Referring to FIG. 18, the mask pattern MP may be removed from the resultant structure of FIG. 17.

A doped layer 210a may be formed on a surface of each of the lower electrodes 210'. In an implementation, a surface portion of each of the lower electrodes 210' may be doped with first impurities to form the doped layer 210a. The doped layer 210a may be formed to cover the outer sidewalls and the inner sidewalls of the lower electrodes 210'. The first impurities may include carbon (C) or boron (B). A content (e.g., atomic percent) of the first impurities in the doped layer 210a may range from 3 at % to 50 at %.

Figure 19:
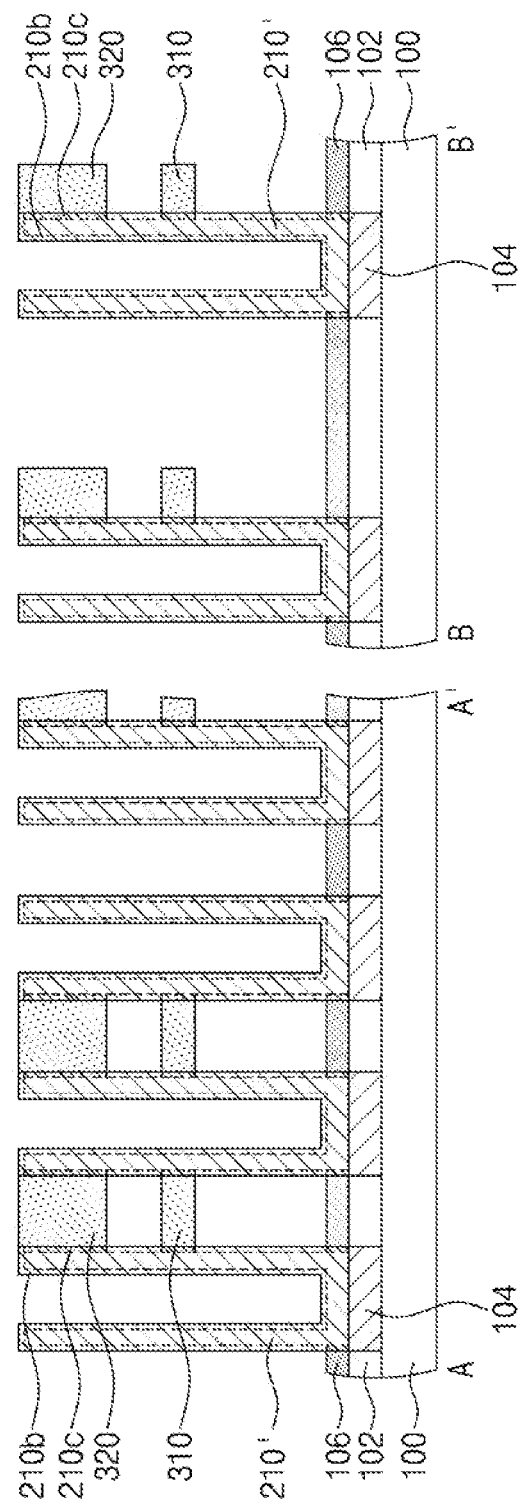

Referring to FIG. 19, the first impurities may be removed from a portion of the doped layer 210a. In an implementation, the first impurities may be removed from first portions 210b of the doped layer 210a, which are exposed (e.g., not covered) by the first and second support patterns 310 and 320 and the etch stop layer 106. In an implementation, an ashing process may be performed on exposed surfaces of the lower electrodes 210', e.g., surfaces of the first portions 210b of the doped layer 210a exposed by the first and second support patterns 310 and 320 and the etch stop layer 106. The ashing process may include a plasma surface treatment process, a thermal treatment process, or an oxidation process. At this time, the ashing process may not be performed on second portions 210c of the doped layer 210a, which are covered by the first and second support patterns 310 and 320 and the etch stop layer 106, and the first impurities may remain in the second portions 210c.

Figure 20:
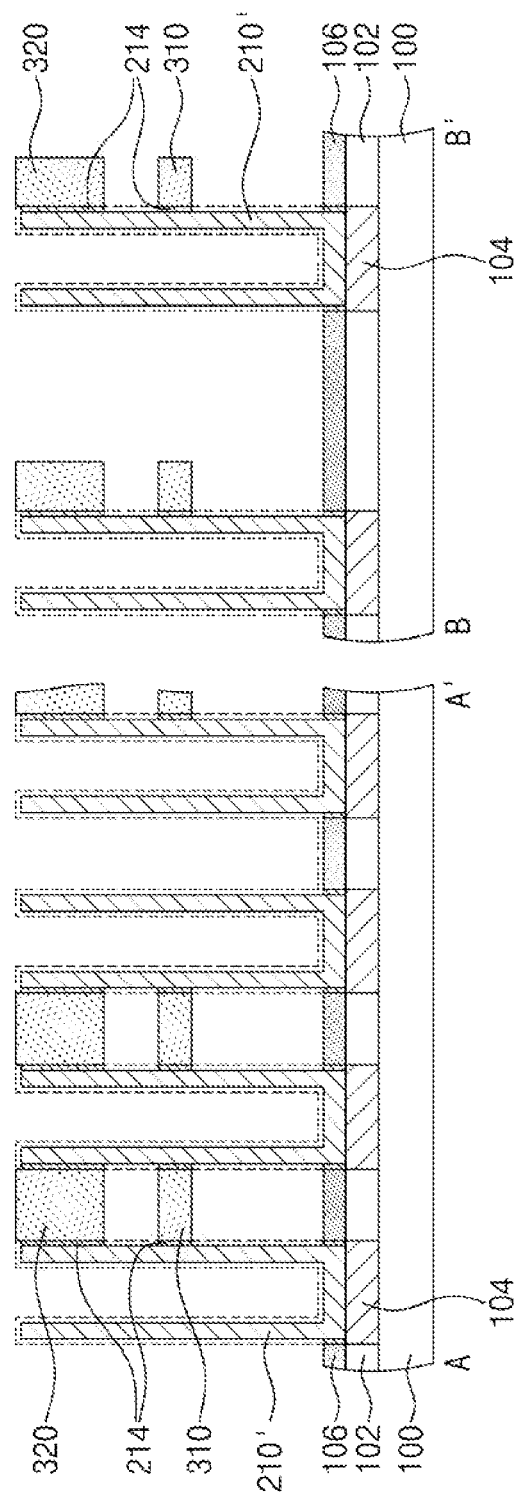

Referring to FIG. 20, the first portions 210b of the lower electrodes 210' may be removed. In an implementation, an isotropic etching process may be performed to etch the exposed first portions 210b. In the etching process, the first portions 210b having a lot of crystal defects may be easily etched, and the pillar portion 212 and the second portions 210c may not be etched. Thus, an undercut caused by etching of portions of the lower electrode 210' located between the pillar portion 212 and the first and second support patterns 310 and 320 may not occur, and it is possible to prevent the first and second support patterns 310 and 320 from being separated from the lower electrodes

210'. The second portions 210c remaining after the etching process may be the connection patterns 214.

Figure 21:
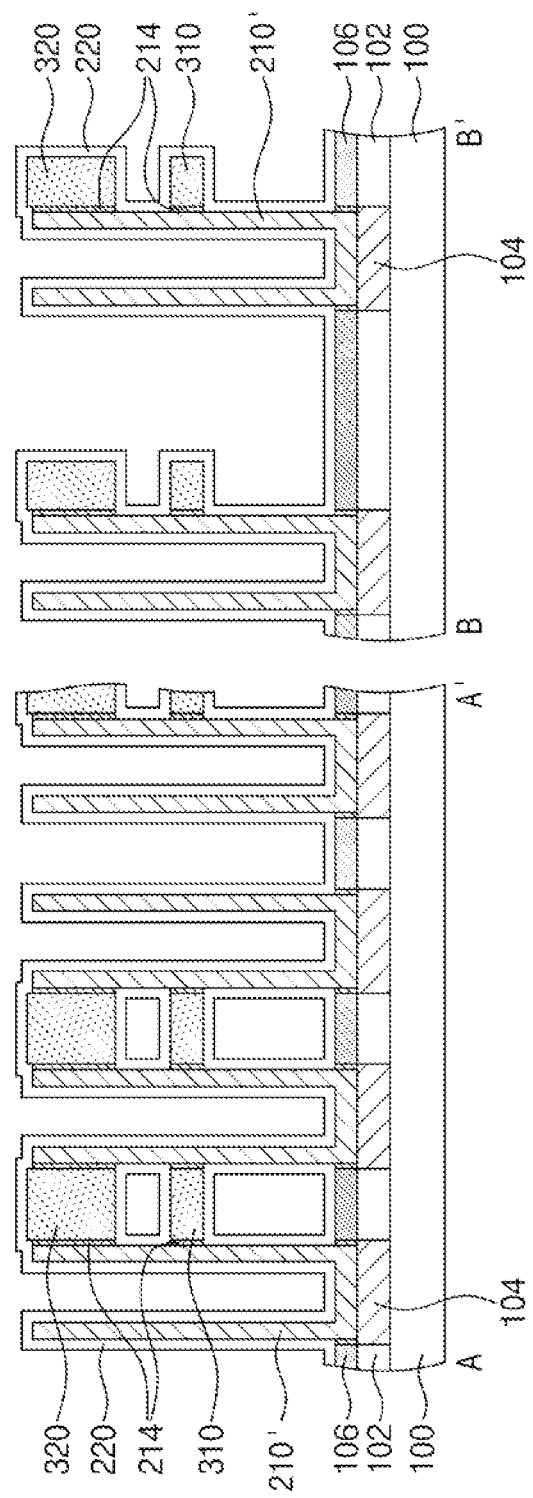

Referring to FIG. 21, a dielectric layer 220 may be formed on an entire top surface of the semiconductor substrate 100. The dielectric layer 220 may be formed with a substantially uniform thickness on the top surface of the etch stop layer 106, the top surfaces, the sidewalls and the bottom surfaces of the first and second support patterns 310 and 320, and exposed surfaces of the lower electrodes 210'. The dielectric layer 220 may cover outer sidewalls and inner sidewalls of the lower electrodes 210'. Due to the presence of the connection patterns 214, the dielectric layer 220 may not be provided between the lower electrode 210' and the first support pattern 310 and between the lower electrode 210' and the second support pattern 320.

Referring again to FIG. 15, an upper electrode 230 may be formed on the dielectric layer 220. In an implementation, the upper electrode 230 may be formed by depositing or coating a conductive material on the semiconductor substrate 100.

The semiconductor device described with reference to FIG. 15 may be manufactured as described above.

Figure 22:
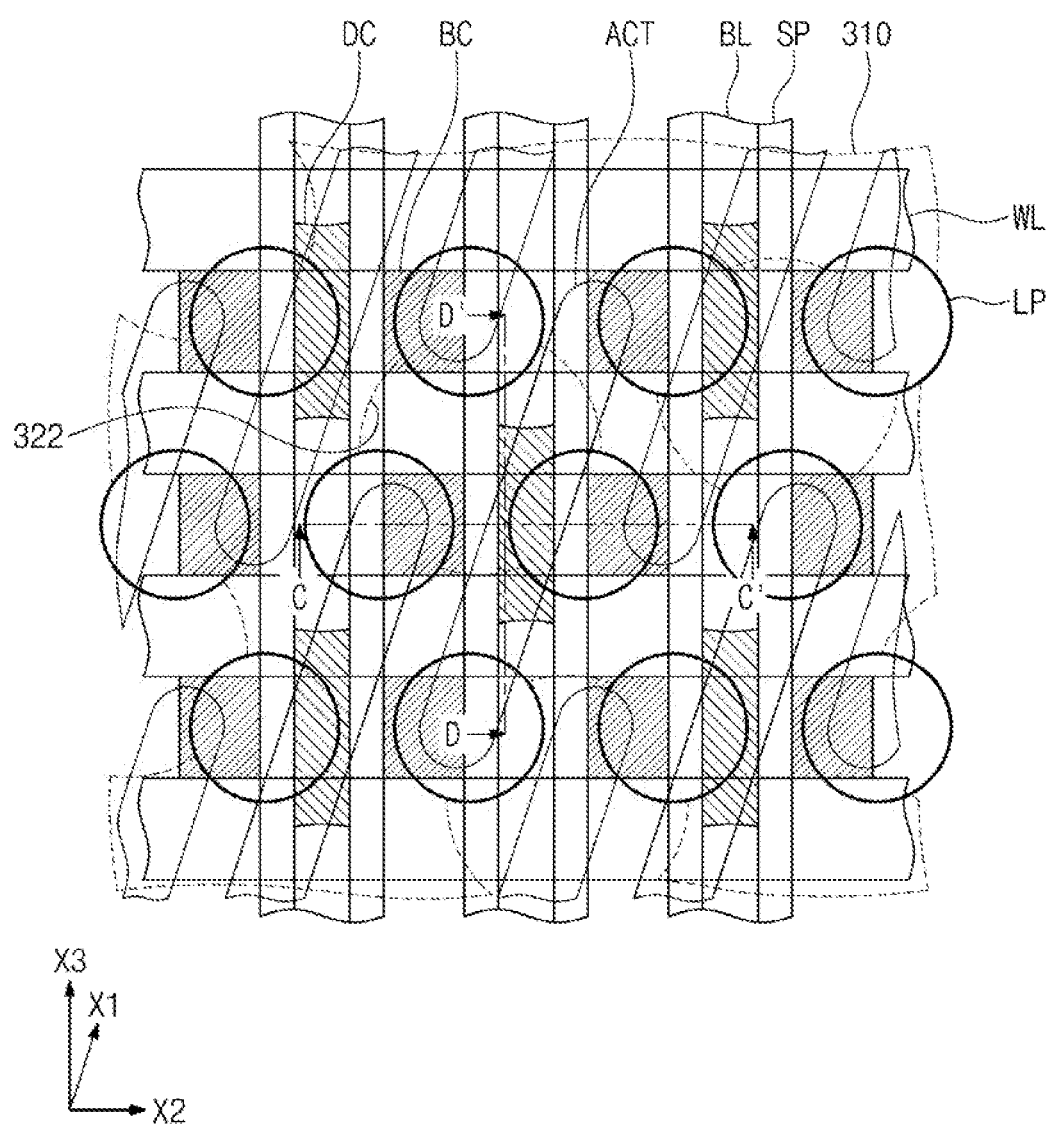
FIG. 22 is a plan view of a semiconductor device according to some example embodiments.
Figure 23:
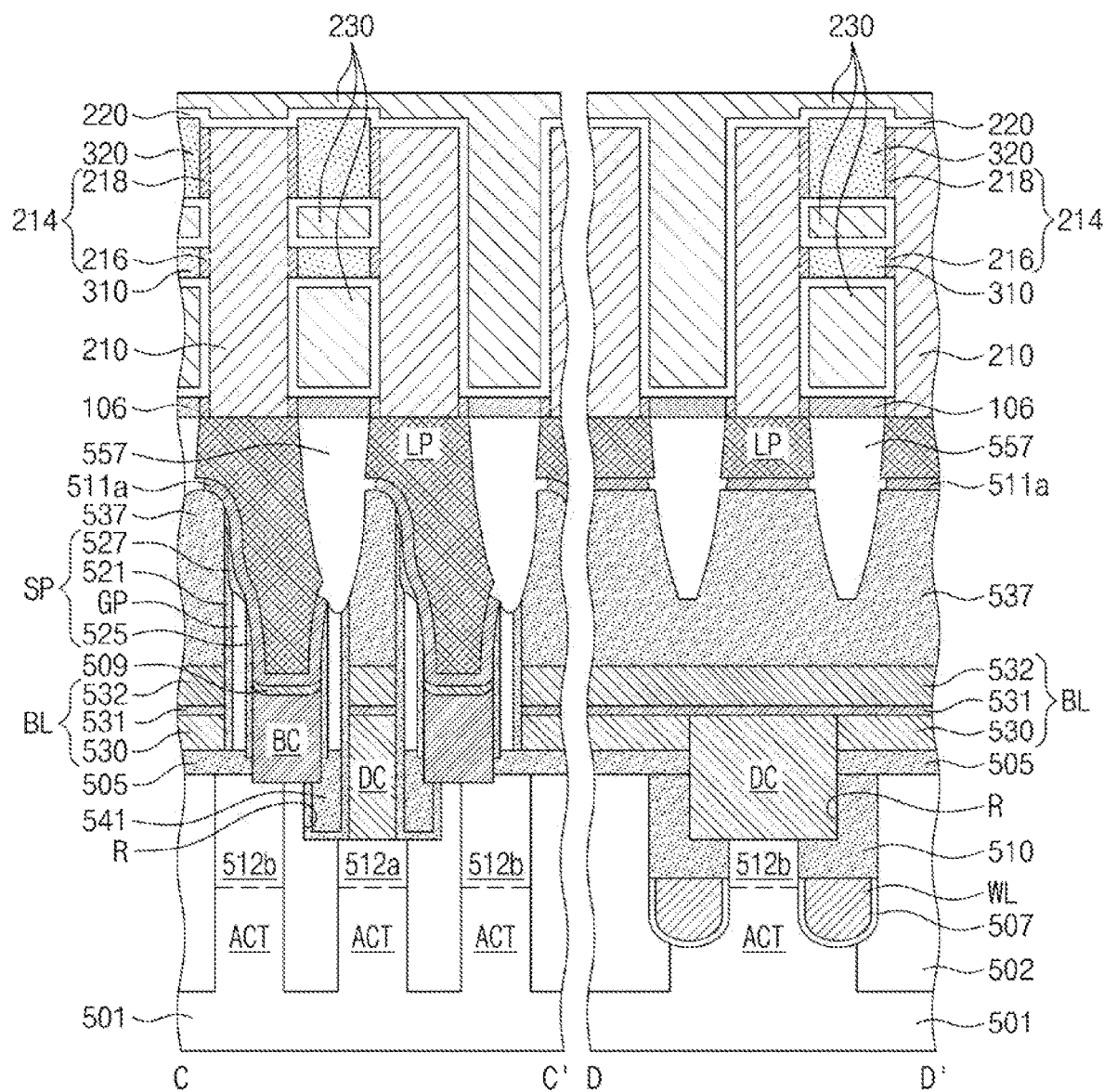
FIG. 23 is a cross-sectional view taken along lines C-C' and D-D' of FIG. 22.

FIG. 22 is a plan view of a semiconductor device according to some example embodiments. FIG. 23 is a cross-sectional view taken along lines C-C' and D-D' of FIG. 22.

Referring to FIGS. 22 and 23, a device isolation pattern 502 may be in a substrate 501 to define active portions (or active regions) ACT. Each of the active portions ACT may have an isolated shape when viewed in a plan view. Each of the active portions ACT may have a bar shape extending in a first direction X1 when viewed in a plan view. Each of the active portions ACT may correspond to a portion of the substrate 501, which is surrounded by the device isolation pattern 502 when viewed in a plan view. The substrate 501 may include a semiconductor material. The active portions ACT may be arranged in parallel to each other in the first direction X1, and an end portion of one active portion ACT may be disposed adjacent to a center of another active portion ACT neighboring to the one active portion ACT.

Word lines WL may intersect the active portions ACT. The word lines WL may be disposed in grooves formed in the device isolation pattern 502 and the active portions ACT. The word lines WL may be parallel to a second direction X2 intersecting the first direction X1. The word lines WL may be formed of a conductive material. A gate dielectric layer 507 may be disposed between each of the word lines WL and an inner surface of each of the grooves. In an implementation, bottoms of the grooves may be relatively deep in the device isolation pattern 502 and may be relatively shallow in the active portions ACT. The gate dielectric layer 507 may include at least one of a thermal oxide, silicon nitride, silicon oxynitride, or a high-k dielectric material. Bottom surfaces of the word lines WL may be rounded.

A first doped region 512a may be in each of the active portions ACT between a pair of the word lines WL, and a pair of second doped regions 512b may be in both edge regions of each of the active portions ACT, respectively. The first and second doped regions 512a and 512b may be doped with, e.g., N-type dopants. The first doped region 512a may correspond to a common drain region, and the second doped regions 512b may correspond to source regions. Each of the word lines WL and the first and second doped regions 512a and 512b adjacent thereto may constitute a transistor. The word lines WL may be in the grooves, and a channel length of a channel region under the word line WL may be increased in a limited planar area. Thus, a short channel effect may be minimized.

Top surfaces of the word lines WL may be lower than top surfaces of the active portions ACT. A word line capping pattern 510 may be on each of the word lines WL. The word line capping patterns 510 may have line shapes extending in a longitudinal direction of the word lines WL and may fully cover the top surfaces of the word lines WL. The word line capping patterns 510 may fill the grooves on the word lines WL. The word line capping patterns 510 may be formed of, e.g., silicon nitride.

An interlayer insulating pattern 505 may be on the substrate 501. In an implementation, the interlayer insulating pattern 505 may include a silicon oxide layer, a silicon nitride layer, a silicon oxynitride layer, or a combination thereof. The interlayer insulating pattern 505 may have island shapes spaced apart from each other in a plan view. The interlayer insulating pattern 505 may cover end portions of two active portions ACT adjacent to each other.

Upper portions of the substrate 501, the device isolation pattern 502 and the word line capping pattern 510 may be partially recessed to form a recess region R. The recess region R may have a mesh shape when viewed in a plan view. A sidewall of the recess region R may be aligned with a sidewall of the interlayer insulating pattern 505.

Bit lines BL may be on the interlayer insulating pattern 505. The bit lines BL may intersect the word line capping patterns 510 and the word lines WL. As illustrated in FIG. 22, the bit lines BL may be parallel to a third direction X3 intersecting the first and second directions X1 and X2. Each of the bit lines BL may include a bit line poly-silicon pattern 530, a bit line ohmic pattern 531 and a bit line metal-containing pattern 532, which are sequentially stacked. The bit line poly-silicon pattern 530 may include undoped poly-silicon or poly-silicon doped with dopants. The bit line ohmic pattern 531 may include a metal silicide layer. The bit line metal-containing pattern 532 may include at least one of a metal (e.g., tungsten, titanium, or tantalum) or a conductive metal nitride (e.g., titanium nitride, tantalum nitride, or tungsten nitride). A bit line capping pattern 537 may be disposed on each of the bit lines BL. The bit line capping patterns 537 may be formed of an insulating material such as silicon nitride.

Bit line contacts DC may be disposed in the recess region R intersecting the bit lines BL. The bit line contacts DC may include undoped poly-silicon or poly-silicon doped with dopants. In a cross section D-D' of FIG. 23, a sidewall of the bit line contact DC may be in contact with a sidewall of the interlayer insulating pattern 505. In the plan view of FIG. 22, the sidewall of the bit line contact DC, which is in contact with the interlayer insulating pattern 505, may be concave. The bit line contact DC may electrically connect the first doped region 512a to the bit line BL.

A lower filling insulation pattern 541 may be in the recess region R in which the bit line contact DC is not disposed. The lower filling insulation pattern 541 may be formed of a silicon oxide layer, a silicon nitride layer, a silicon oxynitride layer, or a combination thereof.

Storage node contacts BC may be between a pair of the bit lines BL adjacent to each other. The storage node contacts BC may be spaced apart from each other. The storage node contacts BC may include undoped poly-silicon or poly-silicon doped with dopants. Top surfaces of the storage node contacts BC may be concave. An insulating pattern may be between the storage node contacts BC between the bit lines BL.

A bit line spacer SP may be between the bit line BL and the storage node contact BC. The bit line spacer SP may include a first sub-spacer 521 and a second sub-spacer 525, which are spaced apart from each other by a gap region GP. The gap region GP may be referred to as an air gap region. The first sub-spacer 521 may cover a sidewall of the bit line BL and a sidewall of the bit line capping pattern 537. The second sub-spacer 525 may be adjacent to the storage node contact BC. The first sub-spacer 521 and the second sub-spacer 525 may include the same material. In an implementation, the first sub-spacer 521 and the second sub-spacer 525 may include silicon nitride.

A bottom surface of the second sub-spacer 525 may be lower than a bottom surface of the first sub-spacer 521. A height of a top end of the second sub-spacer 525 may be lower than a height of a top end of the first sub-spacer 521. Thus, a margin of a subsequent process of forming a landing pad LP may be increased. As a result, it is possible to prevent disconnection between the landing pad LP and the storage node contact BC. The first sub-spacer 521 may extend to cover a sidewall of the bit line contact DC and a sidewall and a bottom of the recess region R. In an implementation, the first sub-spacer 521 may be between the bit line contact DC and the lower filling insulation pattern 541, between the word line capping pattern 510 and the lower filling insulation pattern 541, between the substrate 501 and the lower filling insulation pattern 541, and between the device isolation pattern 502 and the lower filling insulation pattern 541.

A storage node ohmic layer 509 may be on the storage node contact BC. The storage node ohmic layer 509 may include a metal silicide. A diffusion barrier pattern 511a having a substantially uniform thickness may cover the storage node ohmic layer 509, the first and second sub-spacers 521 and 525, and the bit line capping pattern 537. The diffusion barrier pattern 511a may include a metal nitride such as titanium nitride or tantalum nitride. The landing pad LP may be on the diffusion barrier pattern 511a. The landing pad LP may correspond to the lower electrode contact 104 of FIG. 2. The landing pad LP may be formed of a metal-containing material such as tungsten. An upper portion of the landing pad LP may cover a top surface of the bit line capping pattern 537 and may have a width greater than that of the storage node contact BC. A center of the landing pad LP may be shifted from a center of the storage node contact BC in the second direction X2. A portion of the bit line BL may vertically overlap with the landing pad LP. One upper sidewall of the bit line capping pattern 537 may overlap with the landing pad LP and may be covered with a third sub-spacer 527. A pad separation pattern 557 may be between the landing pads LP. The pad separation pattern 557 may correspond to the interlayer insulating layer 102 of FIG. 2. The pad separation pattern 557 may include a silicon nitride layer, a silicon oxide layer, a silicon oxynitride layer, or a porous layer. The pad separation pattern 557 may define a top end of the gap region GP.

Lower electrodes 210 may be on the landing pads LP, respectively. The lower electrodes 210 may correspond to the lower electrodes 210 described with reference to FIGS. 1 to 4. In an implementation, the lower electrode 210 may include a pillar portion and connection patterns 214 protruding from a sidewall of the pillar portion. Portions of the sidewalls of the lower electrodes 210 may be connected to first and second support patterns 310 and 320. The first support pattern 310 may be connected to the lower electrodes 210 by first connection patterns 216, and the second support pattern 320 may be connected to the lower electrodes 210 by second connection patterns 218. The first and second support patterns 310 and 320 may have support holes.

A top surface of the pad separation pattern 557 between the lower electrodes 210 may be covered with an etch stop layer 106. In an implementation, the etch stop layer 106 may include, e.g., an insulating material such as a silicon nitride layer, a silicon oxide layer, or a silicon oxynitride layer. A dielectric layer 220 may cover surfaces of the lower electrodes 210 and surfaces of the support patterns 310 and 320. An upper electrode 230 may cover the dielectric layer 220.

In the semiconductor device according to the present embodiments, the gap region GP may be between the first and second sub-spacers 521 and 525, and a dielectric constant of air/gas/vacuum may be lower than that of silicon oxide. Thus, a parasitic capacitance between the bit line BL and the storage node contact BC may be reduced. In addition, the connection patterns 214 connecting the support patterns 310 and 320 to the lower electrodes 210 may be on the sidewalls of the lower electrodes 210, and thus the lower electrodes 210 may be firmly supported by the support patterns 310 and 320.

In the semiconductor device according to some example embodiments, the connection pattern connecting the pillar portion of the lower electrode to the support pattern may be connected to an entire portion of the sidewall of the support pattern. Thus, the pillar portion and the support pattern may be firmly connected to each other.

In addition, the density of the connection patterns may be increased by the impurities contained in the connection patterns, and thus the connection patterns may firmly connect the lower electrodes to the support pattern. As a result, the structural stability of the semiconductor device may be improved.

The method of manufacturing a semiconductor device according to some example embodiments may help prevent an undercut caused by etching of a portion of the lower electrode between the pillar portion and the support pattern and may help prevent the pillar portion from being separated from the support pattern. Thus, the semiconductor device with improved structural stability may be manufactured.

Furthermore, peripheral portions of the lower electrodes may be partially removed, and widths of the lower electrodes may be reduced. Thus, the integration density of the semiconductor device may be improved.

By way of summation and review, new exposure techniques and/or expensive exposure techniques may be used to form fine patterns, raising issues with respect to highly integrated semiconductor devices. Thus, other integration techniques may be considered.

One or more embodiments may provide a semiconductor device including a capacitor.

One or more embodiments may provide a semiconductor device capable of improving integration density and structural stability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate;
a first insulating layer on the substrate;
a contact structure in the first insulating layer;
a second insulating layer on the first insulating layer;
a lower electrode on the second insulating layer, passing through the second insulating layer, and electrically connected to the contact structure, the lower electrode including a first connection portion and a second connection portion that is on the first connection portion and that is spaced apart from the first connection portion in a vertical direction that is perpendicular to a top surface of the substrate;
a first support pattern on the second insulating layer and connected to the first connection portion of the lower electrode;
a second support pattern on the first support pattern and connected to the second connection portion of the lower electrode;
a dielectric layer on the lower electrode; and
an upper electrode on the dielectric layer,
wherein:
a top surface of the first connection portion of the lower electrode and a bottom surface of the first connection portion of the lower electrode contact the dielectric layer, and
a top surface of the second connection portion of the lower electrode and a bottom surface of the second connection portion of the lower electrode contact the dielectric layer.

2. The semiconductor device of claim 1, wherein the lower electrode includes titanium nitride (TiN), titanium-silicon nitride (TiSiN), titanium-aluminum nitride (TiAlN), tantalum nitride (TaN), or doped poly-silicon.

3. The semiconductor device of claim 1, wherein the first connection portion of the lower electrode or the second connection portion of the lower electrode includes titanium nitride (TiN), titanium-silicon nitride (TiSiN), titanium-aluminum nitride (TiAlN), tantalum nitride (TaN), or doped poly-silicon.

4. The semiconductor device of claim 3, wherein the first connection portion of the lower electrode or the second connection portion of the lower electrode further includes carbon (C) or boron (B).

5. The semiconductor device of claim 1, wherein:
the first connection portion of the lower electrode surrounds a first side surface of the lower electrode, and
the second connection portion of the lower electrode surrounds a second side surface of the lower electrode.

6. The semiconductor device of claim 5, wherein:
the lower electrode includes a third side surface between the first side surface of the lower electrode and the second side surface of the lower electrode, and
the dielectric layer contacts the third side surface of the lower electrode.

7. The semiconductor device of claim 1, wherein:
the lower electrode includes a third connection portion between the lower electrode and the second insulating layer, and
the dielectric layer contacts a top surface of the third connection portion of the lower electrode.

8. The semiconductor device of claim 7, wherein:
the lower electrode includes a fourth side surface between the second insulating layer and the first support pattern, and
the dielectric layer contacts the fourth side surface of the lower electrode.

9. The semiconductor device of claim 1, wherein:
a thickness of the first support pattern in the vertical direction is less than a thickness of the second support pattern in the vertical direction, and
a thickness of the first connection portion of the lower electrode in the vertical direction is less than a thickness of the second connection portion of the lower electrode in the vertical direction.

10. The semiconductor device of claim 1, wherein a thickness of the first connection portion of the lower electrode in the vertical direction is equal to or is greater than a thickness of the first support pattern in the vertical direction.

11. The semiconductor device of claim 1, wherein a thickness of the second connection portion of the lower electrode in the vertical direction is less than a thickness of the second support pattern in the vertical direction.

12. The semiconductor device of claim 1, wherein the second support pattern protrudes beyond a top surface of the lower electrode.

13. The semiconductor device of claim 1, wherein the second support pattern protrudes beyond the top surface of the second connection portion of the lower electrode.

14. The semiconductor device of claim 1, wherein the bottom surface of the second connection portion of the lower electrode is substantially coplanar with a bottom surface of the second support pattern.

15. The semiconductor device of claim 1, wherein the dielectric layer contacts a side surface of the second support pattern.

16. A semiconductor device, comprising:
substrate;
an insulating layer on the substrate;
a lower electrode on the insulating layer, the lower electrode including a first connection portion, a second connection portion that is on the first connection portion and that is spaced apart from the first connection portion, and a side surface between the first connection portion and the second connection portion;
a first support pattern connected to the first connection portion of the lower electrode;
a second support pattern connected to the second connection portion of the lower electrode;
a dielectric layer on the lower electrode; and
an upper electrode on the dielectric layer,
wherein:
a thickness of the first support pattern in a vertical direction that is perpendicular to a top surface of the substrate is less than a thickness of the second support pattern in the vertical direction,
a thickness of the first connection portion of the lower electrode in the vertical direction is less than a thickness of the second connection portion of the lower electrode in the vertical direction, and
the dielectric layer contacts a top surface of the first connection portion of the lower electrode, a bottom surface of the second connection portion of the lower electrode, and the side surface of the lower electrode.

17. The semiconductor device of claim 16, wherein the dielectric layer contacts a bottom surface of the first connection portion of the lower electrode and a top surface of the second connection portion of the lower electrode.

18. The semiconductor device of claim 16, wherein the dielectric layer contacts a side surface of the second support pattern and/or a top surface of the lower electrode.

19. The semiconductor device of claim 16, wherein the first connection portion of the lower electrode or the second connection portion of the lower electrode includes titanium nitride (TiN), titanium-silicon nitride (TiSiN), titanium-aluminum nitride (TiAlN), tantalum nitride (TaN), or doped poly-silicon.

20. The semiconductor device of claim 19, wherein the first connection portion of the lower electrode or the second connection portion of the lower electrode includes carbon (C) or boron (B).

* * * * *